United States Patent
Kim et al.

(10) Patent No.: US 8,338,204 B2
(45) Date of Patent: Dec. 25, 2012

(54) LIGHT EMITTING ELEMENT, A LIGHT EMITTING DEVICE, A METHOD OF MANUFACTURING A LIGHT EMITTING ELEMENT AND A METHOD OF MANUFACTURING A LIGHT EMITTING DEVICE

(75) Inventors: Yu-Sik Kim, Suwon-si (KR); Sang-Joon Park, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/279,790

(22) Filed: Oct. 24, 2011

(65) Prior Publication Data

US 2012/0040479 A1 Feb. 16, 2012

Related U.S. Application Data

(63) Continuation of application No. 12/464,451, filed on May 12, 2009, now abandoned.

(30) Foreign Application Priority Data

May 22, 2008 (KR) .................. 10-2008-0047575

(51) Int. Cl.
H01L 21/20 (2006.01)

(52) U.S. Cl. ................ 438/33; 438/464; 438/483

(58) Field of Classification Search .......... 438/22–47, 438/479–483, 459–465, 113, 977
See application file for complete search history.

(56) References Cited

U.S. PATENT DOCUMENTS

| | | | |
|---|---|---|---|
| 6,071,795 A * | 6/2000 | Cheung et al. | 438/458 |
| 6,078,064 A * | 6/2000 | Ming-Jiunn et al. | 257/103 |
| 6,420,199 B1 * | 7/2002 | Coman et al. | 438/22 |
| 7,462,881 B2 * | 12/2008 | Lee et al. | 257/99 |
| 7,691,656 B2 * | 4/2010 | Bader et al. | 438/29 |
| 7,727,860 B2 * | 6/2010 | Miyazaki et al. | 438/459 |
| 7,863,157 B2 * | 1/2011 | Henley et al. | 438/459 |
| 2007/0105256 A1 * | 5/2007 | Fitzgerald | 438/34 |
| 2008/0131988 A1 * | 6/2008 | Lee et al. | 438/47 |
| 2008/0261378 A1 * | 10/2008 | Yao et al. | 438/458 |
| 2009/0252939 A1 * | 10/2009 | Park et al. | 428/212 |
| 2009/0267096 A1 * | 10/2009 | Kim | 257/98 |
| 2010/0015738 A1 * | 1/2010 | Kim | 438/26 |

FOREIGN PATENT DOCUMENTS

| | | | |
|---|---|---|---|
| JP | 2003-124503 | * | 4/2003 |
| KR | 1020040104232 | * | 10/2004 |
| KR | 1020060066620 | * | 6/2006 |

* cited by examiner

*Primary Examiner* — Savitr Mulpuri
(74) *Attorney, Agent, or Firm* — F. Chau & Associates, LLC

(57) ABSTRACT

The present invention provides a light-emitting element, a method of manufacturing the light-emitting element, a light-emitting device, and a method of manufacturing the light-emitting device. A method of manufacturing a light-emitting element includes: forming a first conductive layer of a first conductive type, a light-emitting layer, and a second conductive layer of a second conductive type on at least one first substrate, forming an ohmic layer on the second conductive layer and bonding the at least one first substrate to a second substrate. The second substrate being larger than the first substrate. The method further includes etching portions of the ohmic layer, the second conductive layer, and the light-emitting layer to expose a portion of the first conductive layer.

22 Claims, 21 Drawing Sheets

LIGHT EMITTING ELEMENT, A LIGHT EMITTING DEVICE, A METHOD OF MANUFACTURING A LIGHT EMITTING ELEMENT AND A METHOD OF MANUFACTURING A LIGHT EMITTING DEVICE

CROSS-REFERENCE TO RELATED APPLICATION

This application is a continuation of U.S. patent application Ser. No. 12/464,451 filed on May 12, 2009, now abandoned which, in turn, claims priority from Korean Patent Application No. 10-2008-0047575 filed on May 22, 2008, the disclosures of which are each incorporated by reference herein in their entireties.

BACKGROUND

1. Technical Field

The present disclosure relates to a light-emitting element, a method of manufacturing the light-emitting element, a light-emitting device, and to a method of manufacturing the light-emitting device.

2. Description of the Related Art

For example, a small substrate with a size of less than about 6 inches is typically used to manufacture light-emitting elements, such as an LED (light emitting diode) and an LD (laser diode). This is because it may be difficult to fabricate a substrate with a size of about 6 inches or more that is used to manufacture the light-emitting elements.

The use of the small substrate may lower throughput, which in turn may make it difficult to reduce the manufacturing costs of the light-emitting element. In addition, manufacturing equipment suitable for a small substrate such as a substrate with a size of about 6 inches or less should be used to manufacture a light-emitting element. As a result, it may be necessary to develop manufacturing equipment suitable for a small substrate.

SUMMARY OF THE INVENTION

Exemplary embodiments of the present invention may provide a method of manufacturing a light-emitting element with high throughput.

Exemplary embodiments of the present invention may provide a method of manufacturing a light-emitting device using the method of manufacturing a light-emitting element.

Exemplary embodiments of the present invention may provide a light-emitting element fabricated by using the method of manufacturing a light-emitting element.

Exemplary embodiments of the present invention may provide a light-emitting device manufactured by using the light-emitting element.

In accordance with an exemplary embodiment of the present invention, a method of manufacturing a light-emitting element is provided. The method includes forming a first conductive layer of a first conductive type, a light-emitting layer, and a second conductive layer of a second conductive type on at least one first substrate, forming an ohmic layer on the second conductive layer, and bonding the at least one first substrate to a second substrate. The second substrate being larger than the first substrate. The method further includes etching portions of the ohmic layer, the second conductive layer, and the light-emitting layer to expose a portion of the first conductive layer.

In accordance with another exemplary embodiment of the present invention, a method of manufacturing a light-emitting element is provided. The method includes performing a first annealing on at least one insulating substrate at a first temperature, and bonding the at least one insulating substrate to a conductive substrate. The conductive substrate being larger than the insulating substrate. The method further includes performing a second annealing on the insulating substrate and the conductive substrate bonded to each other at a second temperature that is lower than the first temperature.

In accordance with still another exemplary embodiment of the present invention, a method of manufacturing a light-emitting element is provided. The method includes foaming a first GaN layer of an n type, a light-emitting layer, a second GaN layer of a p type on at least one sapphire substrate, performing a first annealing on the at least one sapphire substrate, forming an ohmic layer on the second GaN layer, performing a second annealing on the at least one sapphire substrate, and bonding the at least one sapphire substrate to a silicon substrate. The silicon substrate being larger than the sapphire substrate. The method further includes etching portions of the ohmic layer, the second GaN layer, and the light-emitting layer to expose a portion of the first GaN layer, forming a first electrode on the exposed first GaN layer and forming a second electrode on the ohmic layer.

In accordance with yet another exemplary embodiment of the present invention, a method of manufacturing a light-emitting device using the method of manufacturing a light-emitting element according to the above-mentioned aspects is provided.

In accordance with still yet another exemplary embodiment of the present invention, a light-emitting element is provided. The light element includes a substrate, a first conductive pattern of a first conductive type formed on the substrate, a light-emitting pattern formed on the first conductive pattern, a second conductive pattern of a second conductive type formed on the light-emitting pattern and an ohmic pattern formed on the second conductive pattern, wherein the width of the first conductive pattern is larger than that of the light-emitting pattern, and the edge of the second conductive pattern is aligned with the edge of the ohmic pattern.

In accordance with yet still another exemplary embodiment of the present invention, a light-emitting device includes the light-emitting element according to the above-mentioned aspect is provided.

BRIEF DESCRIPTION OF THE DRAWINGS

Exemplary embodiments of the present invention can be understood in more detail from the following description taken in conjunction with the attached drawings, in which.

DETAILED DESCRIPTION OF THE EXEMPLARY EMBODIMENTS OF THE INVENTION

Figure 1:
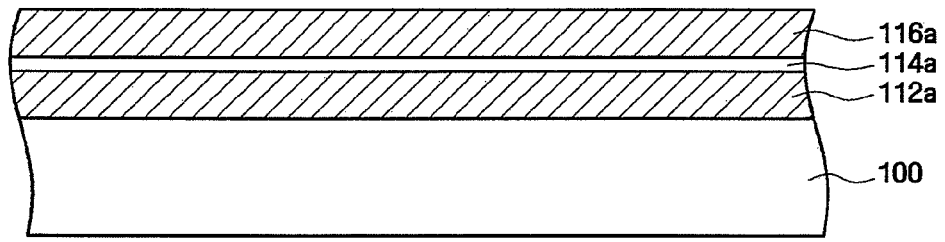
FIGS. 1 to 7 are diagrams illustrating intermediate steps of a method of manufacturing a light-emitting element according to a first exemplary embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Like numbers refer to like elements throughout. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. In the specification, the same components are denoted by the same reference numerals.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, exemplary embodiments of the present invention will be described in detail with reference to the accompanying drawings for clarity of the description of the prevent invention.

FIGS. 1 to 7 are diagrams illustrating intermediate steps of a method of manufacturing a light-emitting element according to a first exemplary embodiment of the invention. FIGS. 8A and 8B are diagrams illustrating a light-emitting element according to the first exemplary embodiment of the invention.

First, referring to FIG. 1, a first conductive layer 112a, a light-emitting layer 114a, and a second conductive layer 116a are sequentially formed on a first substrate 100.

The first conductive layer 112a, the light-emitting layer 114a, and the second conductive layer 116a may include, for example, $In_xAl_yGa_{(1-x-y)}N$ ($0 \leqq x \leqq 1$, and $0 \leqq y \leqq 1$) (that is, various materials including GaN). That is, the first conductive layer 112a, the light-emitting layer 114a, and the second conductive layer 116a may be formed of, for example, AlGaN or InGaN.

The first conductive layer 112a, the light-emitting layer 114a, and the second conductive layer 116a may be sequentially formed on the first substrate 100 by, for example, MOCVD (metal organic chemical vapor deposition), liquid phase epitaxy, hydride vapor phase epitaxy, molecular beam epitaxy, or MOVPE (metal organic vapor phase epitaxy).

Next, the layers will be described in detail. The first conductive layer 112a may be a first conductive type (for example, an n type), and the second conductive layer 116a may be a second conductive type (for example, a p type). However, the first conductive layer 112a may be the second conductive type (p type), and the second conductive layer 116a may be the first conductive type (n type) according to the design.

The light-emitting layer 114a is a region in which carriers (for example, electrons) of the first conductive layer 112a are coupled to carriers (for example, holes) of the second conductive layer 116a to emit light. In addition, the light-emitting layer 114a may include a well layer and a barrier layer. As the well layer has a band gap that is narrower than that of the barrier layer, the carriers (the electrons and the holes) are collected and coupled in the well layer. The light-emitting layer 114a may be classified into, for example, a single quantum well (SQW) structure and a multiple quantum well (MQW) structure according to the number of well layers. The single quantum well structure includes one well layer, and the multiple quantum well structure includes multiple well layers. To adjust emission characteristics, at least one of the well layer and the barrier layer may be doped with, for example, at least one of B, P, Si, Mg, Zn, and Se.

The first substrate 100 may be formed of any material as long as it can grow the first conductive layer 112a, the light-emitting layer 114a, and the second conductive layer 116a. For example, the first substrate 100 may be an insulating substrate that is formed of sapphire ($Al_2O_3$) or zinc oxide (ZnO), or a conductive substrate that is formed of silicon (Si) or silicon carbide (SiC). In the following description, the first substrate 100 is composed of a sapphire substrate.

Also, a buffer layer may be formed between the first substrate 100 and the first conductive layer 112a. The buffer layer may be formed of, for example, $In_xAl_yGa_{(1-x-y)}N$ ($0 \leqq x \leqq 1$, and $0 \leqq y \leqq 1$). The buffer layer is formed to improve the crystallinity of the first conductive layer 112a, the light-emitting layer 114a, and the second conductive layer 116a.

A base substrate having the first conductive layer 112a, the light-emitting layer 114a, and the second conductive layer 116a formed on the substrate 100 may be used.

Figure 2:
Figure 2:
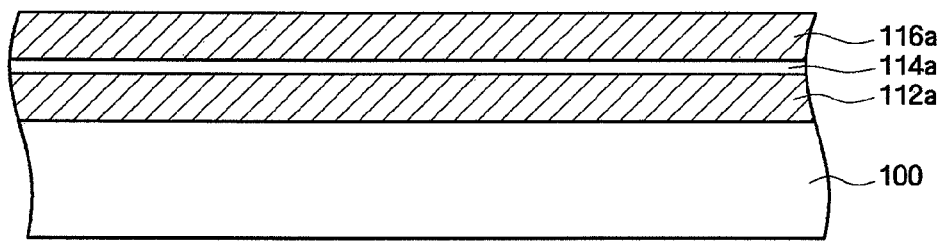

Referring to FIG. 2, to activate the second conductive layer 116a, the first substrate 100 having the first conductive layer 112a, the light-emitting layer 114a, and the second conductive layer 116a formed thereon may be subjected to a first annealing process 181. For example, the first annealing process 181 may be performed at a temperature of about 400° C. Specifically, for example, when the second conductive layer 116a is formed of $In_xAl_yGa_{(1-x-y)}N$ doped with Mg, the first annealing process 181 can reduce the amount of H coupled to Mg. In this way, it is possible to improve the p-type characteristics of the second conductive layer 116a.

Figure 3:
Figure 3:
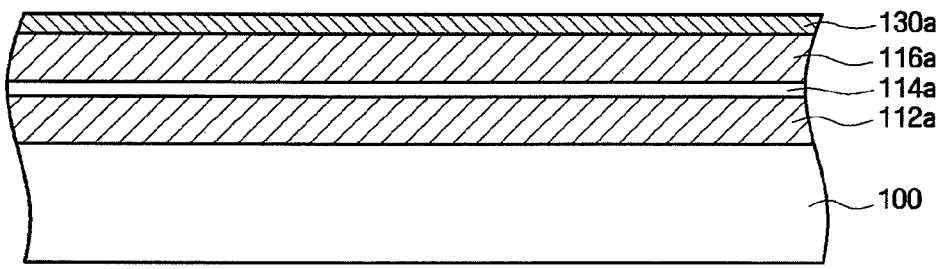

Referring to FIG. 3, an ohmic layer 130a is formed on the second conductive layer 116a. For example, the ohmic layer 130a may include at least one of ITO (indium tin oxide), zinc (Zn), zinc oxide (ZnO), silver (Ag), tin (Ti), aluminum (Al), silver (Au), nickel (Ni), indium oxide ($In_2O_3$), tin oxide ($SnO_2$), copper (Cu), tungsten (W), and platinum (Pt).

To activate the ohmic layer 130a, a second annealing process 182 may be performed on the first substrate 100 having the ohmic layer 130a formed thereon. For example, the second annealing process may be performed at a temperature of about 400° C.

Figure 4A:
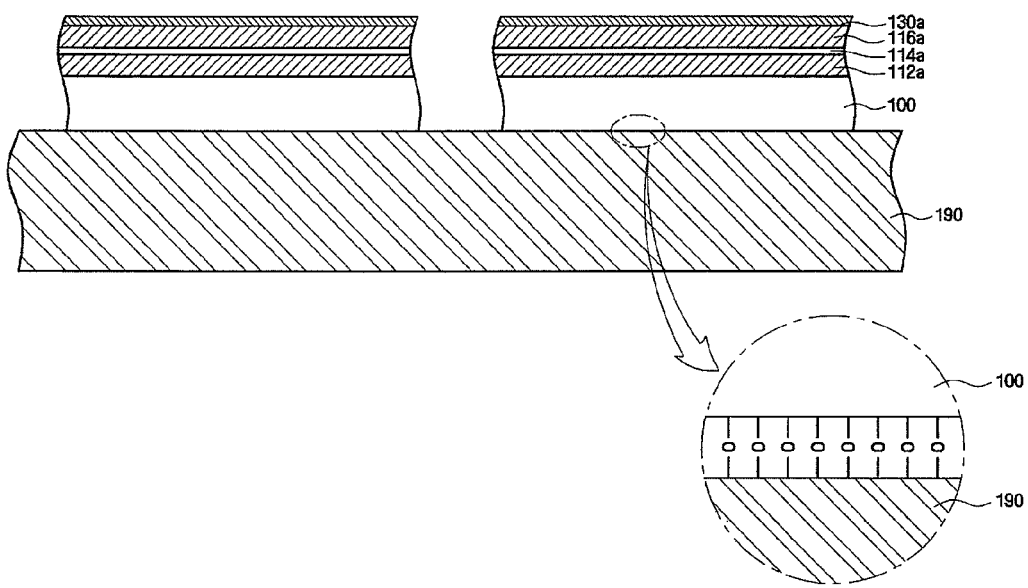
Figure 4B:
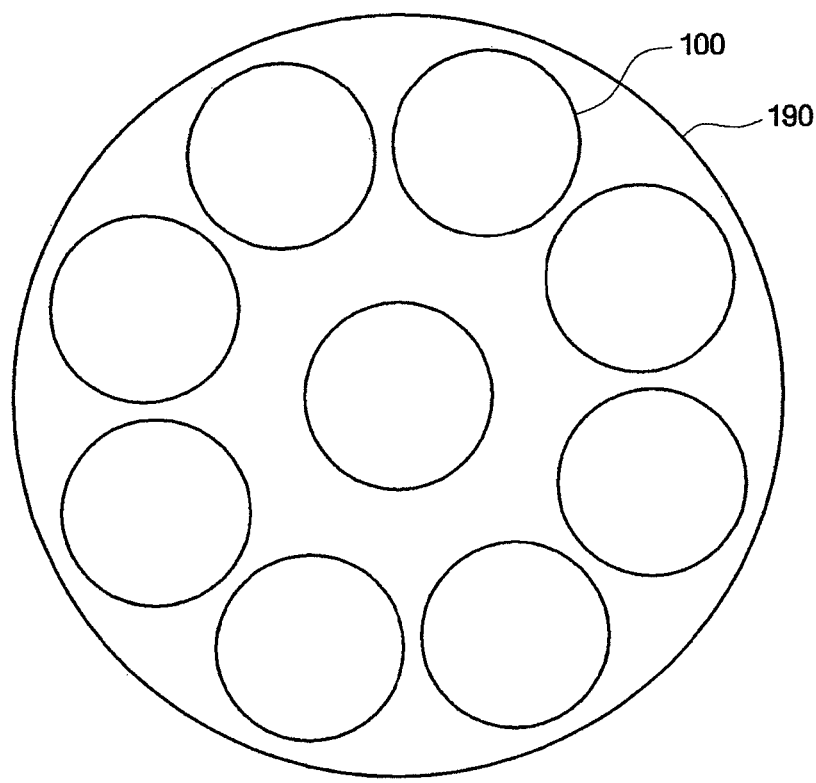

Referring FIGS. 4A and 4B, at least one first substrate 100 is bonded to the second substrate 190.

Specifically, the second substrate 190 is larger than the first substrate 100. That is, when the second substrate 190 overlaps the first substrate 100, the second substrate 190 covers the first substrate 100 so as to conceal the first substrate 100. For example, when the second substrate 190 and the first substrate 100 have circular shapes, the diameter of the second substrate 190 is larger than that of the first substrate 100. For example, the second substrate 190 may have a diameter of about 6 inches or more, that is, about 150 mm or more, and the first substrate 100 may have a diameter of less than about 6 inches. When the second substrate 190 and the first substrate 100 have rectangular shapes, the diagonal of the second substrate 190 may be larger than that of the first substrate 100.

The second substrate 190 may be a conductive substrate or an insulating substrate. For example, the second substrate 190 may be a conductive substrate that is formed of at least one of silicon, strained silicon (Si), silicon alloy, SOI (silicon-on-insulator), silicon carbide (SiC), silicon germanium (SiGe), silicon germanium carbide (SiGeC), germanium, germanium alloy, gallium arsenide (GaAs), indium arsenide (InAs), a III-V semiconductor, a II-VI semiconductor, compositions thereof, and laminates thereof. In addition, the second substrate 190 may be, for example, an insulating substrate that is formed of at least one of aluminum nitride, boron nitride, silicon oxide, silicon nitride, beryllium nitride, quartz, compositions thereof, and laminates thereof. In the following description, the second substrate 190 is the silicon substrate.

Various bonding methods may be used to bond the first substrate 100 to the second substrate 190. In the first exemplary embodiment of the invention, direct bonding is used.

First, to directly bond the first substrate 100 to the second substrate 190, the first substrate 100 and the second substrate 190 may satisfy the following conditions.

The bonding surfaces of the first substrate 100 and the second substrate 190 should be substantially flat and smooth. When the bonding surfaces of the first substrate 100 and the second substrate 190 are curved or rough, it may be difficult to bond the two substrates.

That is, a total thickness variation may need to be adjusted so as to be equal to or smaller than a predetermined value. For example, in the case of an 8-inch wafer, the total thickness variation may be equal to or less than about 6 μm. In the case of a 2-inch wafer, the total thickness variation may be equal to or less than about 1.5 μm.

Therefore, if necessary, a semiconductor polishing technique may be used to polish at least one of the bonding surface of the first substrate 100 and the bonding surface of the second substrate 190. For example, CMP (chemical mechanical polishing) may be used to adjust the surface roughness in the unit of Å. It is preferable that the surface roughnesses of the bonding surface of the first substrate 100 and the bonding surface of the second substrate 190 be equal to or less than about 1 nm when they are measured by an AFM (atomic force microscope). The bonding surfaces of the first and second substrates 100 and 190 may be mirror-polished.

In addition, the bonding surfaces of the first and second substrates 100 and 190 should be well cleaned.

Therefore, if necessary, it is preferable that at least one of the first substrate 100 and the second substrate 190 be well cleaned. The reason is that various impurities adhered to the surfaces of the first and second substrates 100 and 190, such as particles and dust, may be a contamination source. That is, if there are impurities in an interface between the first substrate 100 and the second substrate 190 during the bonding process therebetween, the bonding energy may be weakened. When the bonding energy is weakened, the first substrate 100 may be readily detached from the second substrate 190.

To directly bond the first substrate 100 and the second substrate 190, first, pre-treatment is performed on at least one of the bonding surface of the second substrate 190 and the bonding surface of the first substrate 100.

The pre-treatment may be, for example, plasma treatment and/or wet treatment.

For example, the plasma treatment may use at least one of $O_2$, $NH_3$, $SF_6$, Ar, $Cl_2$, $CHF_3$, and $H_2O$, but is not limited thereto. As the plasma treatment can be performed at a low temperature, it is possible to reduce stress applied to the first and second substrates 100 and 190.

The wet treatment may, for example, use at least one of $H_2SO_4$, $HNO_3$, HCl, $H_2O_2$, $H_5IO_6$, SC-1 (standard clean-1), and SC-2 (standard clean-2), but is not limited thereto. An SC-1 solution may be, for example, $NH_4OH/H_2O_2$, and an SC-2 solution may be, for example, $HCl/H_2O_2$.

The pre-treatment can activate the bonding surfaces of the first and second substrates 100 and 190. That is, the pre-treatment can change the states of the bonding surfaces of the first and second substrates 100 and 190 to be suitable for bonding.

A dangling bond may be generated on the bonding surface of the substrate subjected to the pre-treatment. The dangling bond may be a hydrophilic dangling bond or a hydrophobic dangling bond. For example, when the second substrate 190 is a silicon wafer and the first substrate 100 is a sapphire wafer, "—OH", which is a hydrophilic dangling bond, may be formed on the bonding surface of the first substrate 100 and the bonding surface of the second substrate 190 by the pre-treatment.

Then, the second substrate 190 and at least one first substrate 100 are arranged such that their bonding surfaces face each other. At that time, "—OH" formed on the bonding surface of the first substrate 100 and "—OH" formed on the bonding surface of the second substrate 190 are spontaneously bonded to each other by the Van der Waals' force. As shown in the plan view of FIG. 4B, 9 first substrates 100 having a diameter of about 2 inches may be arranged on one second substrate 190 having a diameter of about 8 inches. The number of first substrates 100 arranged on the second substrate 190 depends on a difference in size between the second substrate 190 and the first substrate 100.

Then, the second substrate 190 and the at least one first substrate 100 that are spontaneously bonded to each other are subjected to, for example, heat treatment or physical compression. Then, as shown in FIG. 4A, the second substrate 190 and the at least one first substrate 100 are connected to each other by a covalent bond. Specifically, when the second substrate 190 is a silicon wafer and the first substrate 100 is a sapphire wafer, the second substrate 190 is coupled to a plurality of first substrates 100 by an oxygen-oxygen covalent bond, as represented by the following chemical formula:

$Si\text{—}OH + HO\text{—}Al_2O_3 \Longrightarrow Si\text{—}O\text{—}Al_2O_3 + H_2O.$ The heat treatment may be performed at a temperature in the range of about 25° C. (room temperature) to about 400° C. When the heat treatment is performed at a high temperature for a long time, it is possible to increase the bonding energy between the second substrate 190 and the first substrate 100. However, when the heat treatment is performed at an excessively high temperature, the second substrate 190 and the first substrate 100 are likely to be curved or cracked. Therefore, it may be necessary to perform the heat treatment in a proper temperature range. As the heat treatment time increases, the bonding energy may increase. However, even when the heat treatment time increases, the bonding energy may not increase after a specific time (for example, several hours) has elapsed. The reason is that, after a specific time has elapsed, "—OH" formed on the bonding surfaces of the second substrate 190 and the plurality of first substrates 100 may all be consumed (that is, this is because "—OH" may all be changed to the oxygen covalent bond). The heat treatment time may be adjusted, if necessary.

Figure 5:
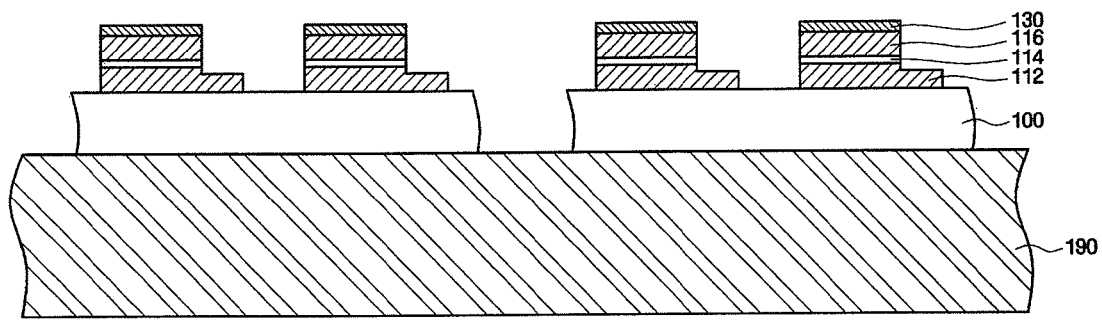

Referring to FIG. 5, the ohmic layer 130a, the second conductive layer 116, the light-emitting layer 114, and the first conductive layer 112 are partially etched in this order to expose a portion of the first conductive layer 112. As a result of the etching, an ohmic pattern 130, a second conductive pattern 116, a light-emitting pattern 114, and a first conductive pattern 112 are formed, as shown in FIG. 5.

Figure 6:
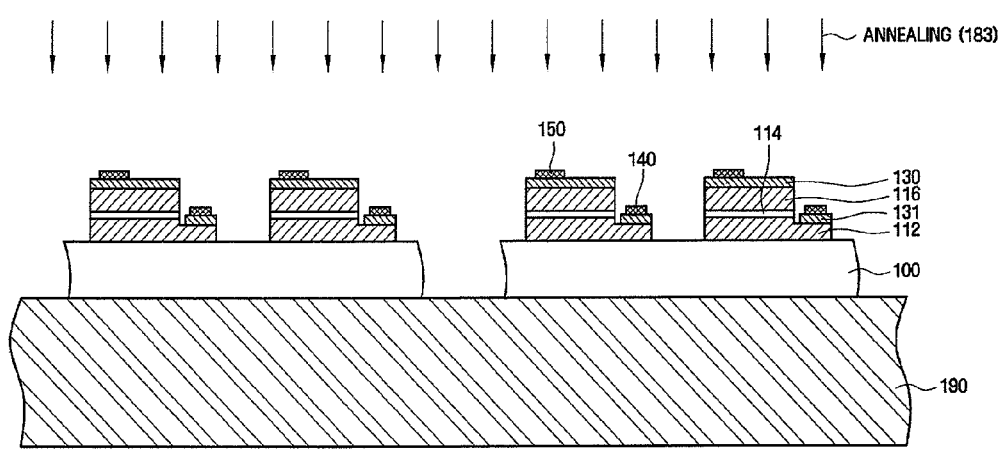

Referring to FIG. 6, an ohmic pattern 131 is foamed on the exposed first conductive pattern 112 (that is, a first electrode forming region) and then a first electrode 140 and a second electrode 150 are formed. For example, the ohmic pattern 131 on the first conductive pattern 112 may include at least one of ITO (indium tin oxide), zinc (Zn), zinc oxide (ZnO), silver (Ag), tin (Ti), aluminum (Al), gold (Au), nickel (Ni), indium oxide ($In_2O_3$), tin oxide ($SnO_2$), copper (Cu), tungsten (W), and platinum (Pt).

Specifically, the first electrode 140 and the second electrode 150 may be formed of the same material or different materials. For example, the first electrode 140 and the second electrode 150 may include at least one of indium tin oxide (ITO), copper (Cu), nickel (Ni), chrome (Cr), gold (Au), titanium (Ti), platinum (Pt), aluminum (Al), vanadium (V), tungsten (W), molybdenum (Mo), and silver (Ag).

Then, the bonded first and second substrates 100 and 190 are subjected to a third annealing process 183. In particular, the temperature of the third annealing process 183 may be lower than that of the first annealing process 181 and/or the second annealing process 182. For example, the third annealing process may be performed at a temperature of about 190° C. or less.

For reference, the third annealing process 183 may be performed in the stage in which the first electrode 140 and the second electrode 150 are not formed. Specifically, after the ohmic layer is formed on the first electrode 140, the third annealing process may be performed.

In particular, in the first exemplary embodiment of the invention, it is preferable that processes after the bonding process (see FIGS. 4A and 4B) be performed at a low temperature. The reason is as follows. When the processes after the bonding process are performed at a high temperature, the interfaces between the bonded first and second substrates 100 and 190 may be stressed. When the amount of stress is large, the first substrate 100 may be detached from the second substrate 190. For this reason, it is preferable that high temperature processes be executed before the bonding process. For example, the temperature of the third annealing process 183 may be lower than the temperature of the first annealing process 181 for activating the second conductive layer 116a and the temperature of the second annealing process 182 for activating the ohmic layer 130a.

Before or after the second electrode 150 is formed, a surface texturing process may be performed to form a texture shape on the surface of the second conductive pattern 116. The texture shape may be formed, for example, by subjecting the surface of the second conductive pattern 116 to wet etching using an etchant, such as KOH. The texture shape may be formed by, for example, dry etching. Light having an angle other than an escape cone angle may be confined in the second conductive pattern 116 due to a difference in refractive index between the second conductive pattern 116 and air. The texture shape makes it possible for many light components to escape from the second conductive pattern 116. As a result, it is possible to improve light emission efficiency.

Figure 7:
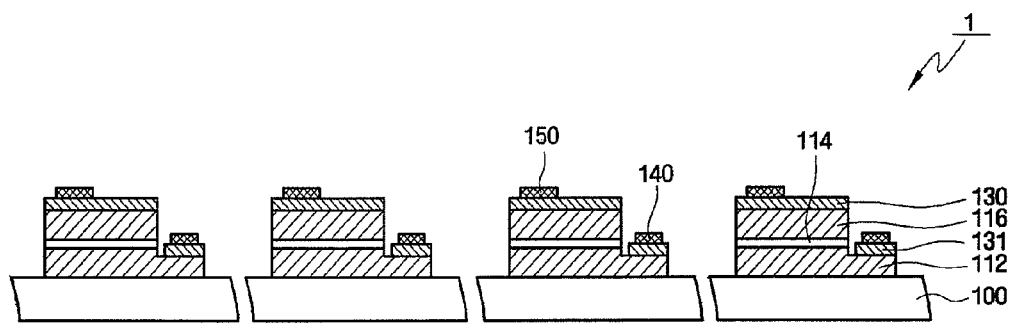
Figure 8A:
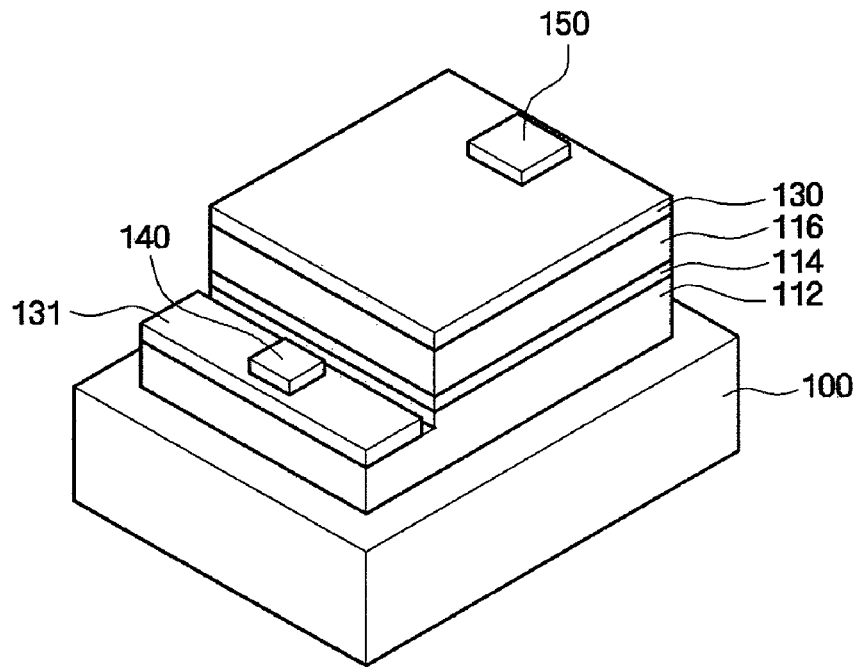
FIGS. 8A and 8B are diagrams illustrating a light-emitting element according to the first exemplary embodiment of the present invention.
Figure 8B:
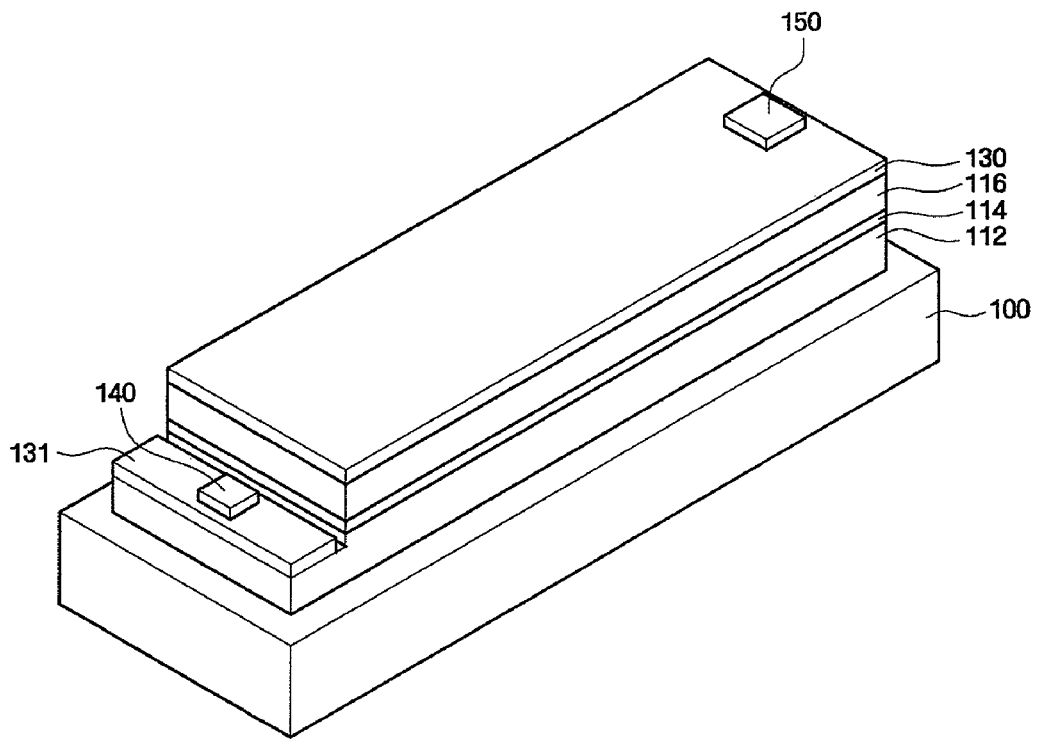

Referring to FIG. 7, the second substrate 190 is removed. For example, a grinding process or a CMP (chemical mechanical polishing) process may be used to remove the second substrate 190.

Then, the thickness of the first substrate 100 is reduced. For example, the CMP process may be performed to reduce the thickness of the first substrate 100 to, for example, about 100 µm.

Then, a sawing process is performed to divide the substrate into chips, thereby completing a light-emitting element 1.

In the manufacturing process according to the first exemplary embodiment of the invention in which a plurality of first small substrates 100 are bonded to the second large substrate 190, only manufacturing equipment suitable for the size of the second large substrate 190 is used, but separate manufacturing equipment for the first small substrates 100 is not needed. In addition, as a large number of first substrates 100 are manufactured at once, it is possible to improve throughput. As a result, it is possible to reduce the manufacturing costs of the light-emitting element 1.

The light-emitting element 1 according to the first exemplary embodiment of the invention will be described with reference to FIGS. 7, 8A, and 8B. The light-emitting element 1 according to the first exemplary embodiment of the invention is manufactured by the manufacturing method described with reference to FIGS. 1 to 7.

Referring to FIGS. 7, 8A, and 8B, the light-emitting element 1 includes the first conductive pattern 112, the light-emitting pattern 114 formed on the first conductive pattern 112, the second conductive pattern 116 formed on the light-emitting pattern 114, and the ohmic patterns 130 and 131 formed on the first conductive pattern 112 and the second conductive pattern 116. However, in the first exemplary embodiment of the invention, the edge of the second conductive pattern 116 is aligned with the edge of the ohmic pattern 130.

As described above, to decrease the temperatures of the processes after the bonding process (see FIGS. 4A and 4B), the ohmic layer 130a is formed before the bonding process (see FIG. 3). Then, after the bonding process, the ohmic pattern 130, the second conductive pattern 116, the light-emitting pattern 114, and the first conductive pattern 112 are etched at the same time (see FIG. 5). Therefore, the edge of the second conductive pattern 116 is aligned with the edge of the ohmic pattern 130.

Meanwhile, the light-emitting element 1 may be used for a top view type package and a side view type package. In the top view type package, generally, a rectangular light-emitting element having a size of, for example, about 1 mm×1 mm shown in FIG. 8A is used. The top view type package directly emits light to an object, and is generally used for an illuminating device and a display device. On the other hand, in the side view type package, a rectangular light-emitting element having, for example, a size of about 150 μm×400 μm shown in FIG. 8B is used, but the structure thereof may be changed depending upon the desired purpose. The side view type package is generally used for a mobile device (for example, a mobile phone, an MP3 player, and a navigation system) and a display device. The top view type package and the side view type package may be different from each other in size and shape, but substantially similar to each other in configuration and operation.

Next, the operation of the light-emitting element 1 will be described.

When the first conductive pattern 112 is an n type and the second conductive pattern 116 is a p type, a first bias (V−, I−, or the ground voltage) is applied to the first conductive pattern 112 through the first electrode 140 and a second bias (V+ or I+) is applied to the second conductive pattern 116 through the second electrode 150. Therefore, a forward bias is applied to a light-emitting structure 110. The forward bias causes the light-emitting pattern 114 to emit light.

Figure 9:
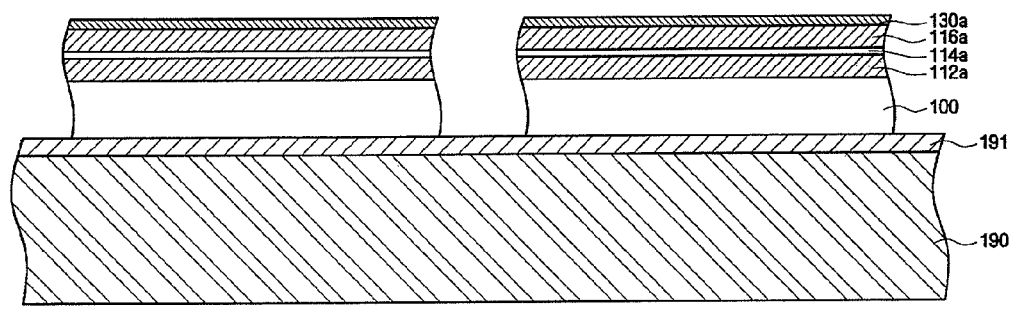
FIG. 9 is a diagram illustrating a method of manufacturing a light-emitting element according to a second exemplary embodiment of the present invention.
Figure 10:
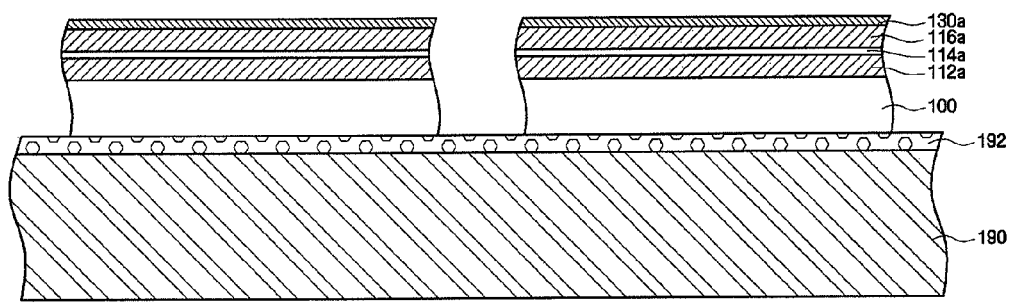
FIG. 10 is a diagram illustrating a method of manufacturing a light-emitting element according to a third exemplary embodiment of the present invention.

FIG. 9 is a diagram illustrating a method of manufacturing a light-emitting element according to a second exemplary embodiment of the invention. FIG. 10 is a diagram illustrating a method of manufacturing a light-emitting element according to a third exemplary embodiment of the invention.

Referring to FIGS. 9 and 10, the method of manufacturing the light-emitting element according to the second and third exemplary embodiments differs from that according to the first exemplary embodiment in that the first substrate 100 is not directly bonded to the second substrate 190, but rather the first substrate 100 is bonded to the second substrate 190 by an adhesive. In the adhesive bonding, intermediate material layers 191 and 192 are interposed between the first substrate 100 and the second substrate 190. When the intermediate material layer 191 has a sufficient thickness, the intermediate material layer 191 can compensate for the slight curvature of the first substrate 100 or the second substrate 190.

The intermediate material layers 191 and 192 may be formed on the bonding surface of the second substrate 190 and/or the bonding surface of the first substrate 100, and the first substrate 100 and the second substrate 190 may be bonded to each other by, for example, thermal compression or physical compression. In FIGS. 9 and 10, for the convenience of explanation, the intermediate material layer 191 is formed on the bonding surface of the second substrate 190.

As shown in FIG. 9, the intermediate material layer 191 may be, for example, a metal layer that is formed of a conductive material. For example, the metal layer may include at least one of Au, Ag, Pt, Ni, Cu, Sn, Al, Pb, Cr, and Ti. That is, the metal layer may be, for example, a single layer formed of Au, Ag, Pt, Ni, Cu, Sn, Al, Pb, Cr, or Ti, a laminate thereof, or a composition thereof. For example, the metal layer may be an Au layer, an Au—Sn layer, or a multilayer formed by alternately laminating Au and Sn layers.

As shown in FIG. 10, the intermediate material layer 192 may be an organic layer. The organic layer may be, for example, BCB (benzocyclobutene). The BCB has been sold as Dow Cyclotene. The BCB is suitable to manufacture a semiconductor device. As the BCB is highly resistant to most of wet etchants, it may be difficult to remove the BCB. In general, the BCB is removed usually only by dry etching. The BCB may generate less stress than a silicon oxide ($SiO_2$). That is, even when the BCB is formed with a large thickness, the second substrate 190 may not be curved or cracked.

Next, a method of manufacturing a light-emitting device using the method of manufacturing the light-emitting element according to the first to third exemplary embodiments of the invention will be described. Examples of the light-emitting device include a light-emitting package (see FIGS. 11 to 17) manufactured using the light-emitting element and a light-emitting system (see FIGS. 18 to 25) manufactured using the light-emitting element and/or the light-emitting package.

Figure 11:
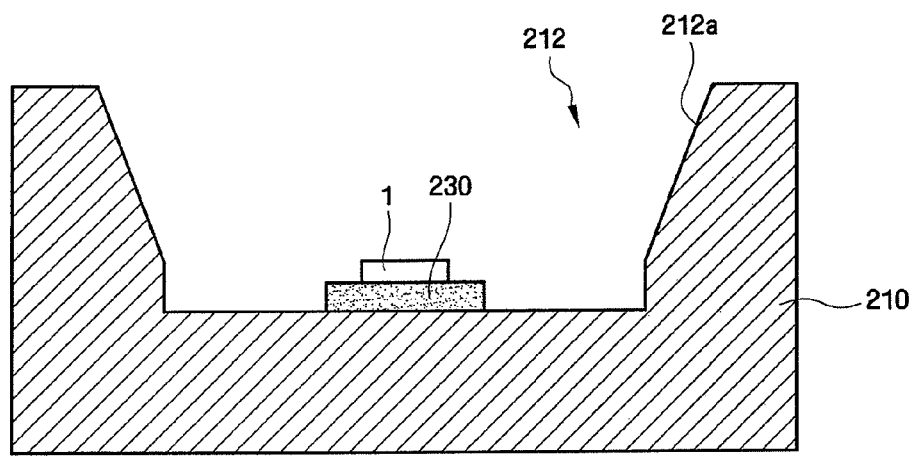
FIGS. 11 and 12 are diagrams illustrating intermediate steps of a method of manufacturing a light-emitting package according to the first exemplary embodiment of the present invention.
Figure 12:
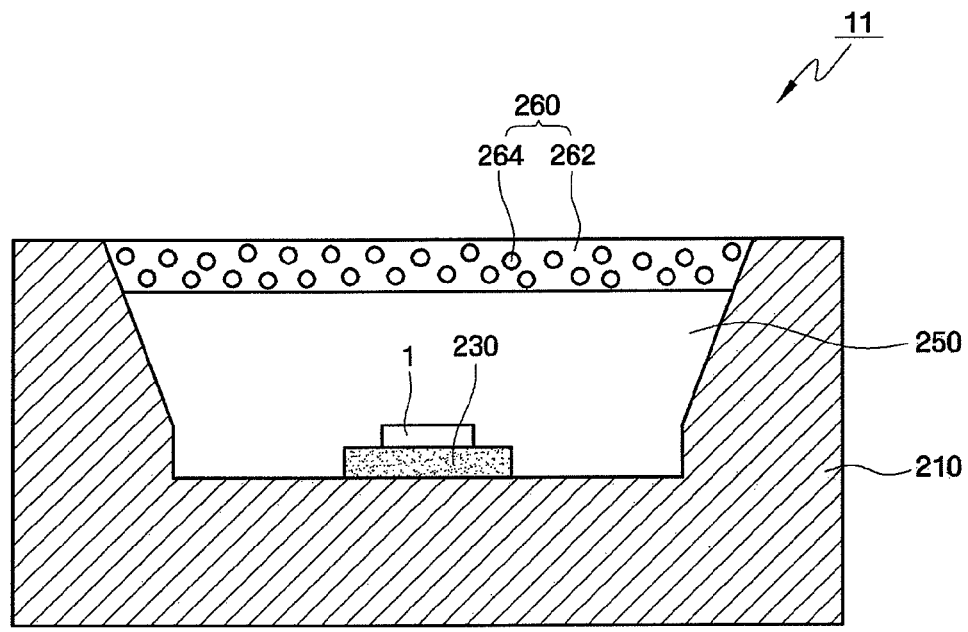

FIGS. 11 and 12 are diagrams illustrating intermediate steps of a method of manufacturing the light-emitting package according to the first exemplary embodiment of the invention. For clarity of the description of the invention, FIGS. 11 and 12 simply show main parts. FIG. 13 and FIGS. 14A to 14C are diagrams illustrating connection between a package body and a light-emitting element in detail. FIGS. 14A to 14C are cross-sectional views taken along the line XIV-XIV of FIG. 13.

First, referring to FIG. 11, the light-emitting element 1 is arranged on a package body 210.

Specifically, the package body 210 may include a slot 212 therein, and the light-emitting element 1 may be provided in the slot 212. In particular, a side wall 212a of the slot 212 may be inclined. Light emitted from the light-emitting element 1 may be reflected from the side wall 212a and then travel forward.

In the drawings, the light-emitting element 1 is connected to a sub mount 230, and the light-emitting element 1 connected to the sub mount 230 is provided in the slot 212 of the package body 210. However, the exemplary embodiments of the present invention are not limited thereto. For example, the light-emitting element 1 may be directly provided on the package body 210 without using the sub mount 230.

Various methods may be used to connect the package body 210 and the light-emitting element 1. For example, connecting methods shown in FIG. 13 and FIGS. 14A to 14C may be used.

Figure 13:
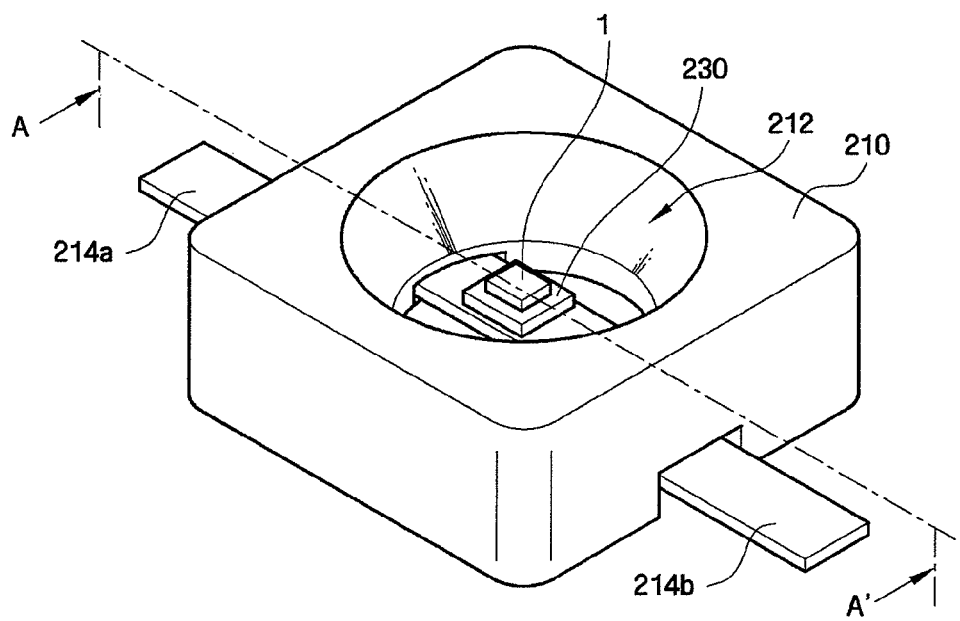
FIGS. 13 and 14A to 14C are diagrams specifically illustrating connection between a package body and a light-emitting element.
Figure 14A:
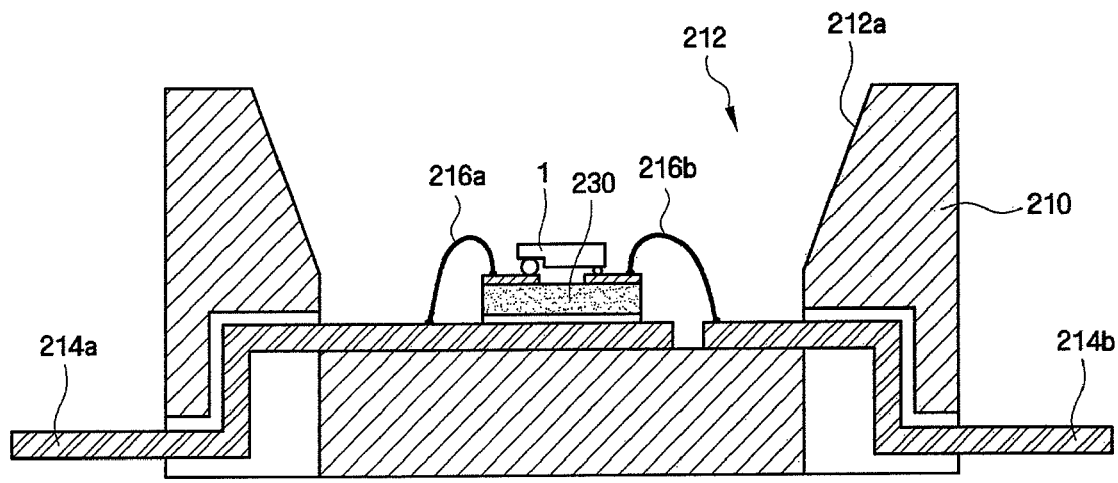
Figure 14B:
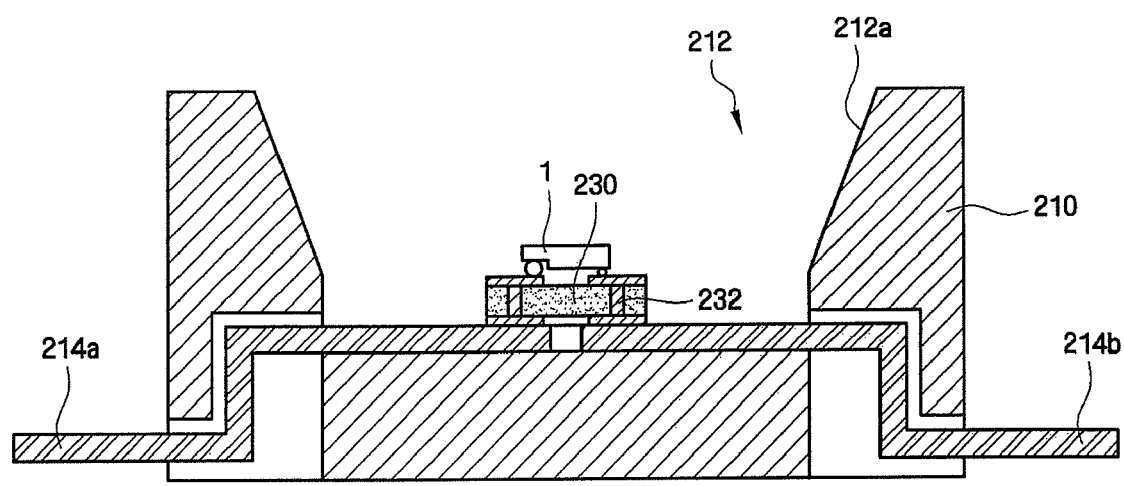
Figure 14C:
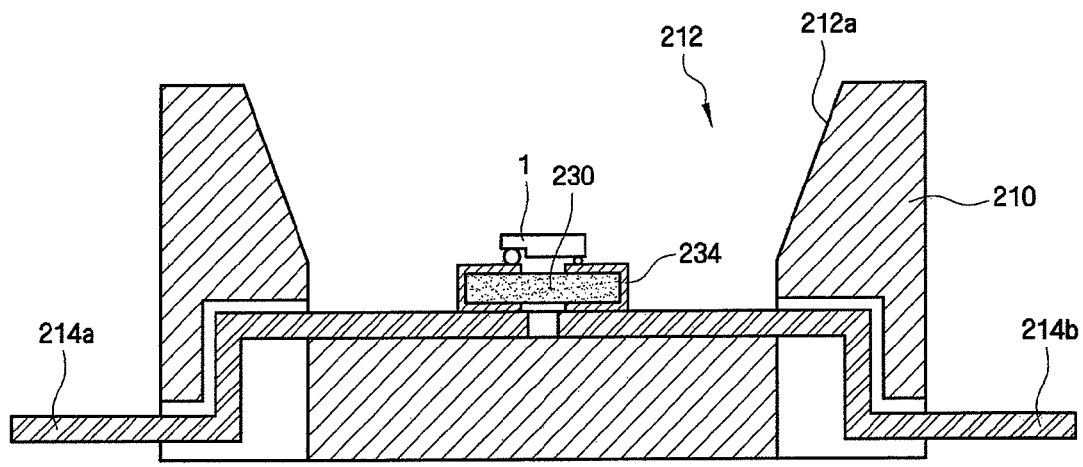

Referring to FIGS. 13 and 14A, the light-emitting element 1 may be mounted to the sub mount 230. In the drawings, the light-emitting element 1 is connected in a flip chip manner, but the exemplary embodiments of the present invention are not limited thereto. For example, the light-emitting element 1 may be connected in a lateral manner. In the flip chip connection, the first electrode and the second electrode are connected so as to face the bottom of the package. In a lateral-type LED, the first electrode and the second electrode are connected so as to face the upper surface of the package. In FIG. 13, the light-emitting element 1 has a rectangular shape used for the top view type package, but the exemplary embodiments of the present invention are not limited thereto. For example, the light-emitting element 1 may have a rectangular shape used for the side view type package.

The light-emitting element 1 may be a UV light-emitting element 1 that emits UV light or a blue light-emitting element 1 that emits blue light, that is, light having a blue wavelength.

The light-emitting element 1 is arranged in the slot 212 of the package body 210. The slot 212 is larger than the light-emitting element 1. The size of the slot 212 may be determined in consideration of the amount of light which is emitted from the light-emitting element 1 and reflected from the side wall 212a of the slot 212, the reflection angle thereof, the kind of transparent resin (reference numeral 250 in FIG. 12) filling the slot 212, and the kind of phosphor layer (reference numeral 260 in FIG. 12). It is preferable that the light-emitting element 1 be arranged at the center of the slot 212. When the distance between the light-emitting element 1 and the side wall 212a is constant, it is easy to prevent color irregularity.

The package body 210 may be formed of an organic material having high resistance, such as, for example, silicon resin, epoxy resin, acrylic resin, urea resin, fluororesin, or imide resin, or an inorganic material having high resistance, such as glass or silica gel. In addition, the package body 210 may be formed of heat-resistant resin such that it is not melted by heat during a manufacturing process. In addition, to reduce the thermal stress of resin, various fillers, such as, for example, aluminum nitride, aluminum oxide, and a compound thereof, may be mixed with the resin. The material forming the package body 210 is not limited to resin. A portion (for example, the side wall 212a) of or the entire package body 210 may be formed of, for example, a metal material or a ceramic material. For example, when the entire package body 210 is formed of a metal material, it may be relatively easy to dissipate heat generated from the light-emitting element 1. FIG. 3A shows the case in which the entire package body 210 is formed of a metal material.

In addition, leads 214a and 214b electrically connected to the light-emitting element 1 are provided in the package body 210. The light-emitting element 1 may be electrically connected to the sub mount 230, and the sub mount 230 and the leads 214a and 214b may be connected to each other by, for example, wires 216a and 216b, respectively. The leads 214a and 214b may be formed of a material having high thermal conductivity to directly dissipate heat generated from the light-emitting element 1 to the outside through the leads 214a and 214b.

The light-emitting package shown in FIG. 14B differs from the light-emitting package shown in FIG. 14a in that the sub mount 230 and the leads 214a and 214b are not connected to each other by the wires (216a and 216b in FIG. 14A), but they are connected to each other by vias 232 that are provided in the sub mount 230.

Further, the light-emitting package shown in FIG. 14C differs from the light-emitting package shown in FIG. 14A in that the sub mount 230 and the leads 214a and 214b are not connected to each other by the wires (216a and 216b in FIG. 14A), but they are connected to each other by a wiring line 234 that is provided on the upper, side, and rear surfaces of the sub mount 230.

The light-emitting package shown in FIG. 14B and the light-emitting package shown in FIG. 14C do not use any wire. Therefore, it is possible to reduce the size of a light-emitting package.

As described with reference to FIGS. 13 to 14C, the invention can be applied to various light-emitting packages. In the specification, the following drawings simply show main parts to prevent the scope of the exemplary embodiments of the invention from being limited.

Referring to FIG. 12 again, the transparent resin layer 250 is formed on the light-emitting element 1. Specifically, the transparent resin layer 250 fills at least a portion of the slot 212. For example, as shown in FIG. 12, the transparent resin layer 250 may not completely fill the slot 212. The material forming the transparent resin layer 250 may not be particularly limited as long as it can fill up the slot 212 of the package body 210. For example, the transparent resin layer 250 may be formed of an epoxy resin, a silicon resin, a hard silicon resin, a modified silicon resin, a urethane resin, oxetane resin, an acrylic resin, a polycarbonate resin, or a polyimide resin.

Then, the phosphor layer 260 is formed on the transparent resin layer 250. The phosphor layer 260 may be formed of a mixture of a transparent resin 262 and a phosphor 264. The phosphor 264 dispersed in the phosphor layer 260 absorbs light emitted from the light-emitting package 1 and converts it into light with a different wavelength. Therefore, as the phosphor 264 is dispersed well, the emission characteristics are improved. As a result, the wavelength conversion efficiency and the color mixture effect of the phosphor 264 can be improved.

For example, the phosphor layer 260 may be formed in the light-emitting package to emit white light. When the light-emitting package 11 emits blue light, the phosphor 264 may include a yellow phosphor, and it may also include a red phosphor to improve a color rendering index (CRI) characteristic. When the light-emitting package 11 emits UV light, the phosphor 264 may include all of the red, green, and blue phosphors.

The transparent resin 262 is not particularly limited as long as it can stably disperse the phosphor 264. For example, the transparent resin 262 may be, for example, an epoxy resin, a silicon resin, a hard silicon resin, a modified silicon resin, a urethane resin, an oxetane resin, an acrylic resin, a polycarbonate resin, or a polyimide resin.

The phosphor 264 is not particularly limited as long as it can absorb light from the light-emitting element 1 and convert it into light having a different wavelength. For example, the phosphor is preferably at least one selected from the following materials: a nitride-based phosphor or an oxynitride-based phosphor that is mainly activated by a lanthanoid element, such as Eu or Ce; an alkaline earth element halogen apatite phosphor, an alkaline earth metal element boride halogen phosphor, an alkaline earth metal element aluminate phosphor, alkaline earth element silicate, alkaline earth element sulfide, alkali earth element thiogallate, alkaline earth element silicon nitride, and germanate that are mainly activated by a lanthanoid element, such as Eu, or a transition metal element, such as Mn; rare earth aluminate and rare earth silicate that are mainly activated by a lanthanoid element, such as Ce; and an organic compound and an organic complex that are mainly activated by a lanthanoid element, such as Eu. Specifically, the following phosphors may be used, but the exemplary embodiments of the present invention are not limited to thereto.

The nitride-based phosphors that are mainly activated by a lanthanoid element, such as Eu or Ce include, for example, $M2Si_5N_8$:Eu (M is at least one element selected from the group consisting of Sr, Ca, Ba, Mg, and Zn). In addition to $M_2Si_5N_8$:Eu, $MSi_7N_{10}$:Eu, $M_{1.8}Si_5O_{0.2}N_8$:Eu, $M_{0.9}Si_7O_{0.1}N_{10}$:Eu (M is at least one element selected from the group consisting of Sr, Ca, Ba, Mg, and Zn) may also be included.

The oxynitride-based phosphors mainly activated by a lanthanoid element, such as Eu or Ce, include, for example, $MSi_2O_2N_2$:Eu (M is at least one element selected from the group consisting of Sr, Ca, Ba, Mg, and Zn).

The alkaline earth element halogen apatite phosphors mainly activated by a lanthanoid element, such as Eu, or a transition metal element, such as Mn, include, for example, $M_5(PO_4)_3$X:R (M is at least one element selected from the group consisting of Sr, Ca, Ba, Mg, and Zn, X is at least one element selected from the group consisting of F, Cl, Br, and I, and R is at least one element selected from the group consisting of Eu, Mn, and a combination of Eu and Mn).

The alkaline earth metal element boride halogen phosphors include, for example, $M_2B_5O_9X:R$ (M is at least one element selected from the group consisting of Sr, Ca, Ba, Mg, and Zn, X is at least one element selected from the group consisting of F, Cl, Br, and I, and R is at least one element selected from the group consisting of Eu, Mn, and a combination of Eu and Mn).

The alkaline earth metal element aluminate phosphors include, for example, $SrAl_2O_4:R$, $Sr_4Al_{14}O_{25}:R$, $CaAl_2O_4:R$, $BaMg_2Al_{16}O_{27}:R$, and $BaMgAl_{10}O_{17}:R$ (R is at least one element selected from the group consisting of Eu, Mn, and a combination of Eu and Mn).

The alkaline earth sulfide-based phosphors include, for example, $La_2O_2S:Eu$, $Y_2O_2S:Eu$, and $Gd_2O_2S:Eu$.

The rare earth aluminate phosphors mainly activated by a lanthanoid element, such as Ce, include, for example, YAG phosphors having the compositions of $Y_3Al_5O_{12}:Ce$, $(Y_{0.8}Gd_{0.2})_3Al_5O_{12}:Ce$, $Y_3(Al_{0.8}Ga_{0.2})_5O_{12}:Ce$, and $(Y, Gd)_3(Al, Ga)_5O_{12}:Ce$. The rare earth aluminate phosphors may also include, for example, $Tb_3Al_5O_{12}:Ce$ and $Lu_3Al_5O_{12}:Ce$ wherein a part or the whole of Y is substituted with, for example, Tb or Lu.

The alkaline earth element silicate phosphor may consist of silicate, and a representative example thereof is, for example, $(SrBa)_2SiO_4:Eu$.

Other phosphors include, for example, $ZnS:Eu$, $Zn_2GeO_4:Mn$, and $MGa_2S_4:Eu$ (M is at least one element selected from the group consisting of Sr, Ca, Ba, Mg, and Zn, and X is at least one element selected from the group consisting of F, Cl, Br and I).

The above-mentioned phosphors may include, for example, at least one element selected from the group consisting of Tb, Cu, Ag, Au, Cr, Nd, Dy, Co, Ni, and Ti, instead of or in addition to Eu, if necessary.

Other phosphors having the same performance and effect as those described above may also be used.

Figure 15:
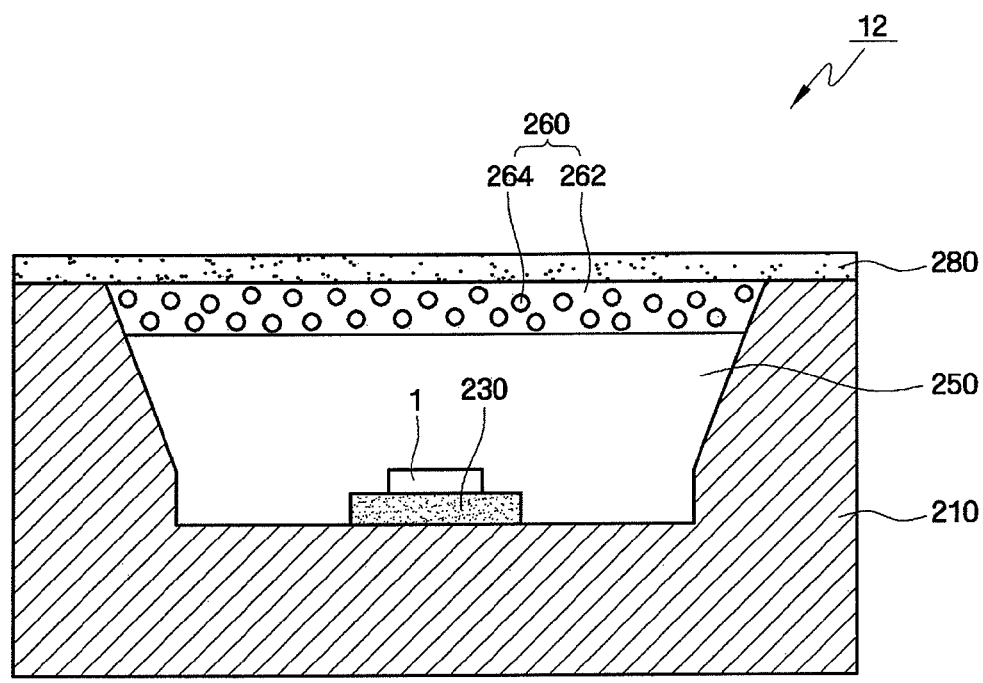
FIGS. 15 to 17 are diagrams illustrating light-emitting packages according to second to fourth exemplary embodiments of the present invention.
Figure 16:
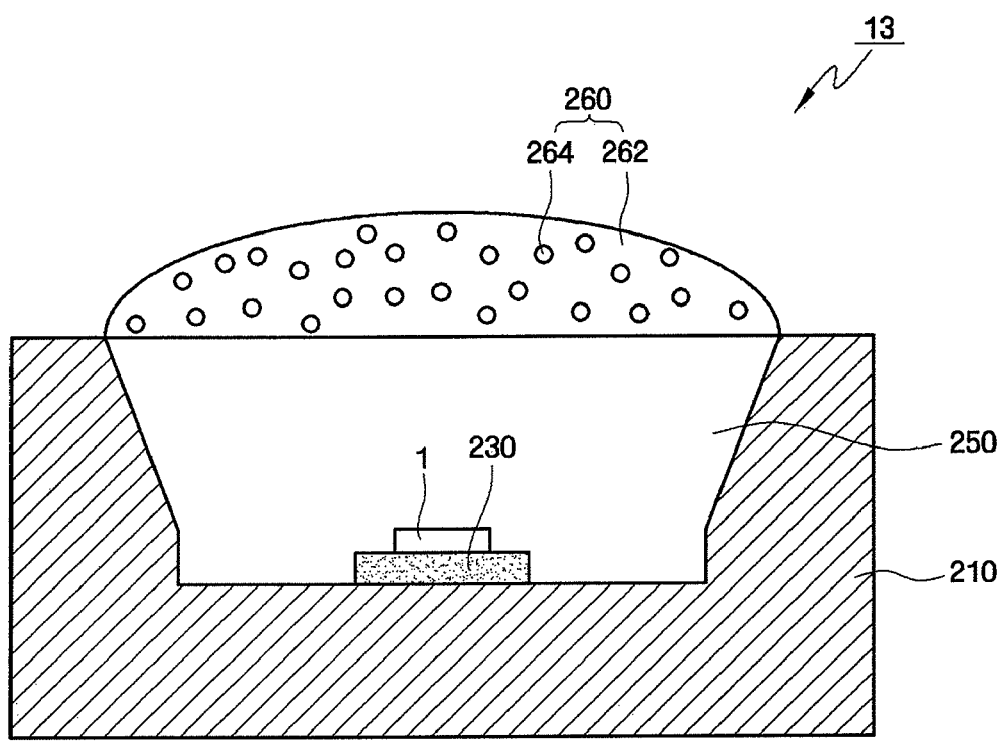
Figure 17:
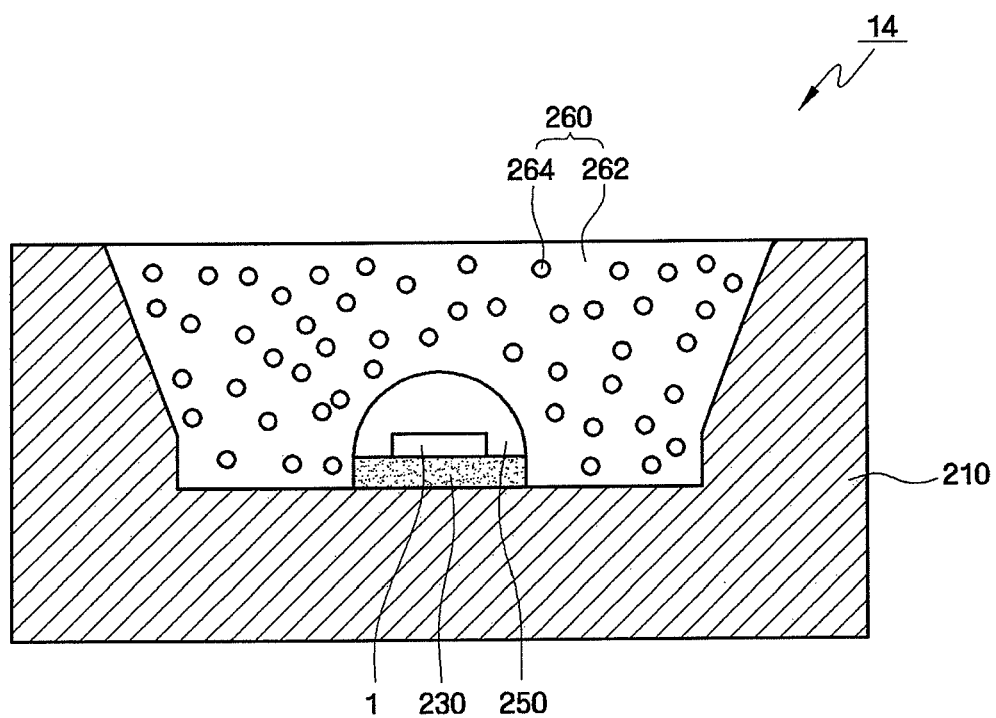

FIGS. 15 to 17 are diagrams illustrating light-emitting packages according to the second to fourth exemplary embodiments of the invention. As those skilled in the art can derive a method of manufacturing the light-emitting packages according to the second to fourth exemplary embodiments of the invention from the method of manufacturing the light-emitting package according to the first exemplary embodiment of the invention, a description thereof will be omitted.

First, referring to FIG. 15, a light-emitting package 12 according to the second embodiment of the invention differs from that according to the first exemplary embodiment in that a filter 280 is formed on the phosphor layer 260. The filter 280 absorbs light having a specific wavelength. For example, the filter 280 may absorb light that is primarily emitted from the light-emitting element 1, and may not absorb light that is secondarily emitted from the phosphor layer 260. The filter 280 may be formed of a material that absorbs light having a specific wavelength and dissipates heat. For example, the filter 280 may be formed of an inorganic dye or an organic dye.

In particular, when the light-emitting element 1 emits UV light, a UV filter 280 may be used. This is because an excessively large amount of UV light may be harmful to the human body.

Referring to FIG. 16, a light-emitting package 13 according to the third exemplary embodiment of the invention differs from that according to the first exemplary embodiment in that the phosphor layer 260 is formed in a lens shape. The phosphor layer 260 may have a predetermined curvature to improve the diffusion characteristics and the extraction characteristics of light emitted from the light-emitting element 1. In FIG. 16, the phosphor layer is formed in a convex lens shape, but it may be formed in a concave lens shape, if necessary.

Referring to FIG. 17, a light-emitting package 14 according to the fourth exemplary embodiment of the invention differs from that according to the first exemplary embodiment in that the transparent resin layer 250 is formed on only the light-emitting element 1 and the sub mount 230. The phosphor layer 260 is formed on the transparent resin layer 250 so as to fill up the slot 212.

Figure 18:
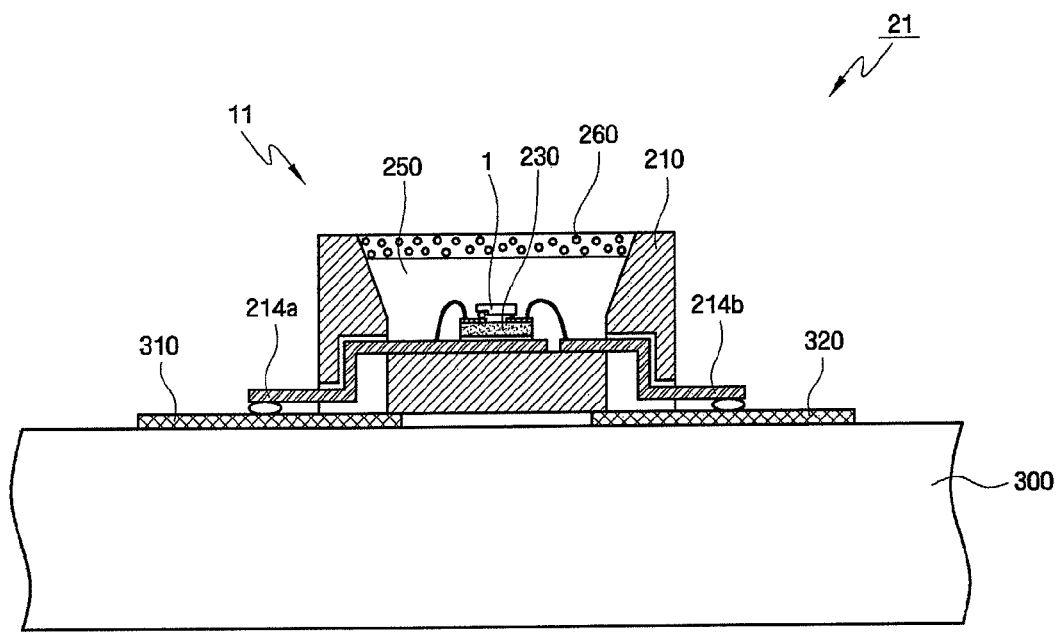
FIG. 18 is a diagram illustrating a light-emitting system according to the first exemplary embodiment of the present invention.

FIG. 18 is a diagram illustrating a light-emitting system according to the first exemplary embodiment of the invention.

Referring to FIG. 18, a light-emitting system 21 according to the first exemplary embodiment of the invention includes a circuit board 300 and the light-emitting package 11 arranged on the circuit board 300.

The circuit board 300 includes a first conductive region 310 and a second conductive region 320 that are electrically isolated from each other. The first conductive region 310 and the second conductive region 320 are provided on one surface of the circuit board 300.

The first conductive region 310 is electrically connected to the lead 214a of the light-emitting package 11, and the second conductive region 320 is electrically connected to the lead 214b of the light-emitting package 11. The first and second conductive regions 310 and 320 may be respectively connected to the leads 214a and 214b by solder.

Figure 19:
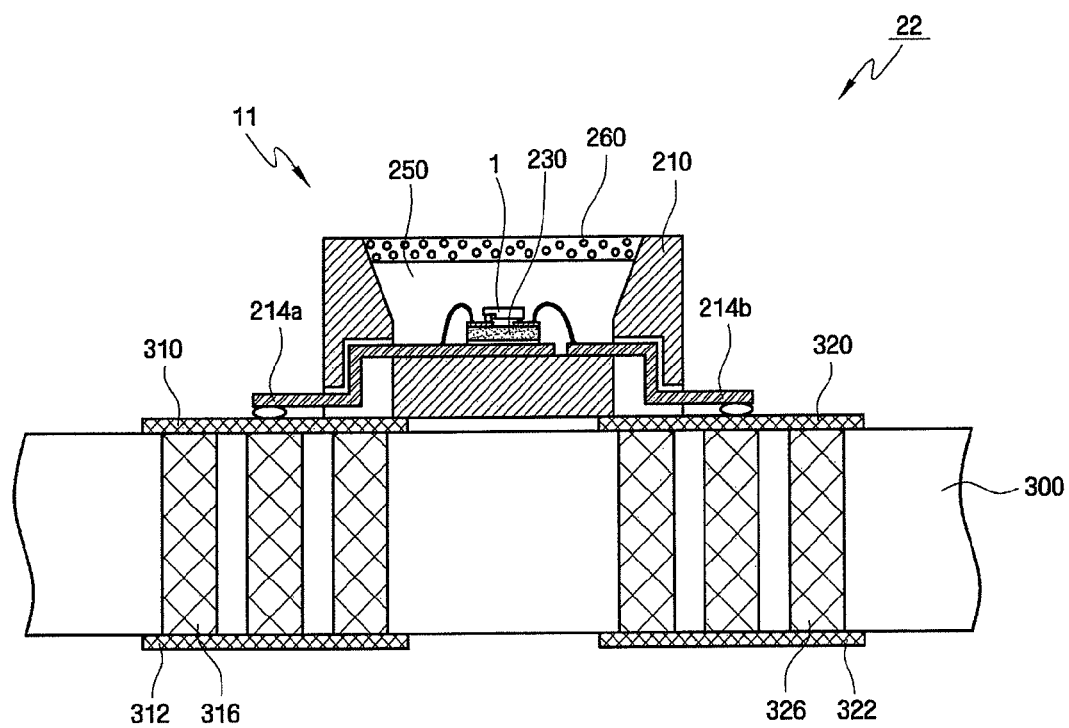
FIG. 19 is a diagram illustrating a light-emitting system according to the second exemplary embodiment of the present invention.

FIG. 19 is a diagram illustrating a light-emitting system according to the second exemplary embodiment of the invention.

Referring to FIG. 19, a light-emitting system 22 according to the second exemplary embodiment of the invention differs from that according to the first exemplary embodiment in that the circuit board 300 includes through vias 316 and 326.

Specifically, the first conductive region 310 and the second conductive region 320 are formed on one surface of the circuit board 300 so as to be electrically isolated from each other, and a third conductive region 312 and a fourth conductive region 322 are formed on the other surface of the circuit board 300 so as to be electrically isolated from each other. The first conductive region 310 and the third conductive region 312 are connected to each other through the first through via 316, and the second conductive region 320 and the fourth conductive region 322 are connected to each other through the second through via 326. The first conductive region 310 is electrically connected to the lead 214a of the light-emitting package 11, and the second conductive region 320 is electrically connected to the lead 214b of the light-emitting package 11.

Figure 20:
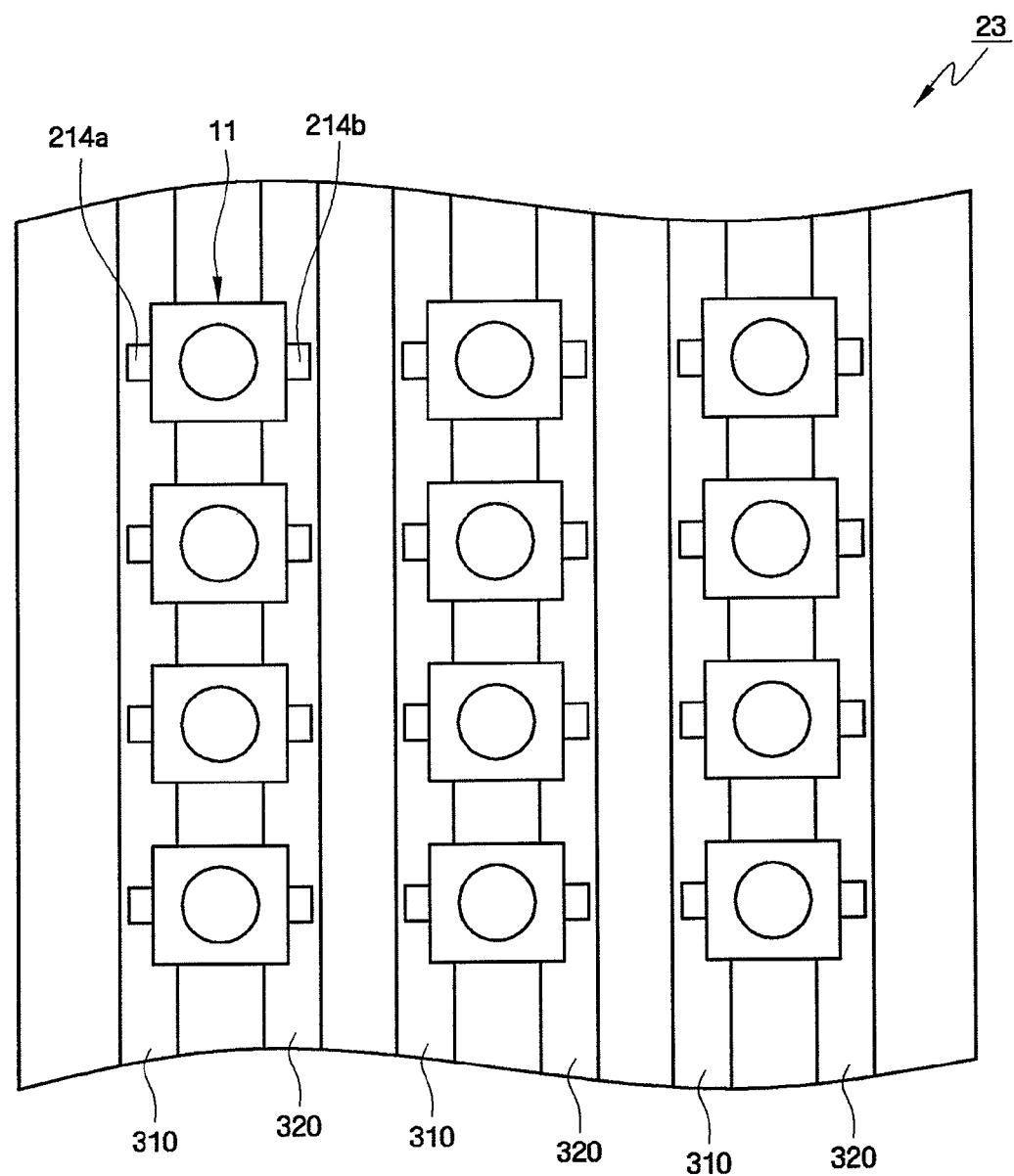
FIGS. 20 to 21B are diagrams illustrating a light-emitting system according to the third exemplary embodiment of the present invention.
Figure 21A:
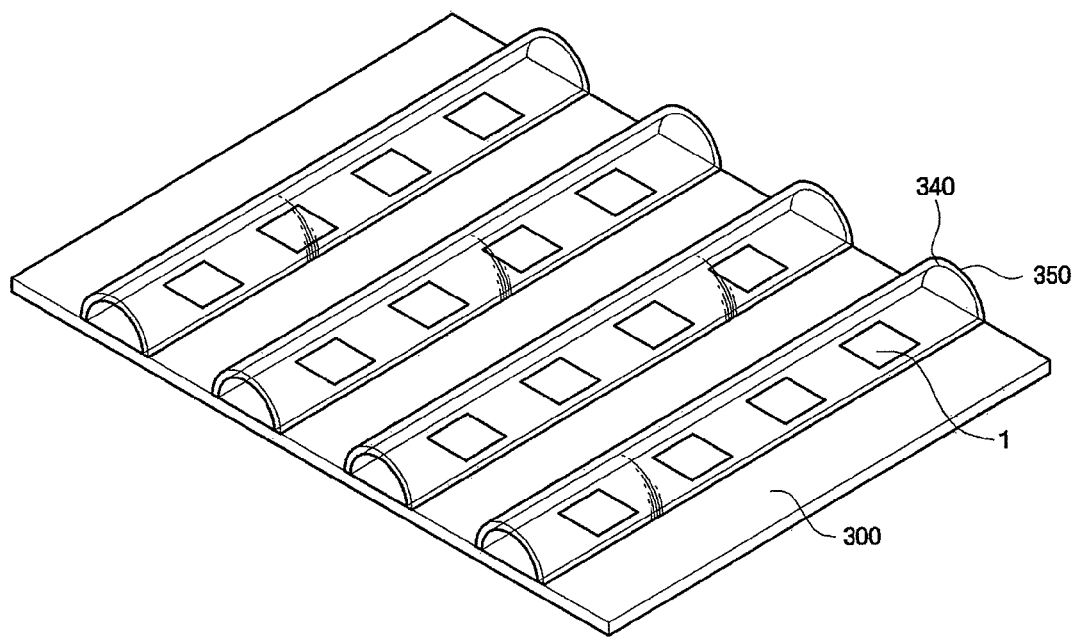
Figure 21B:
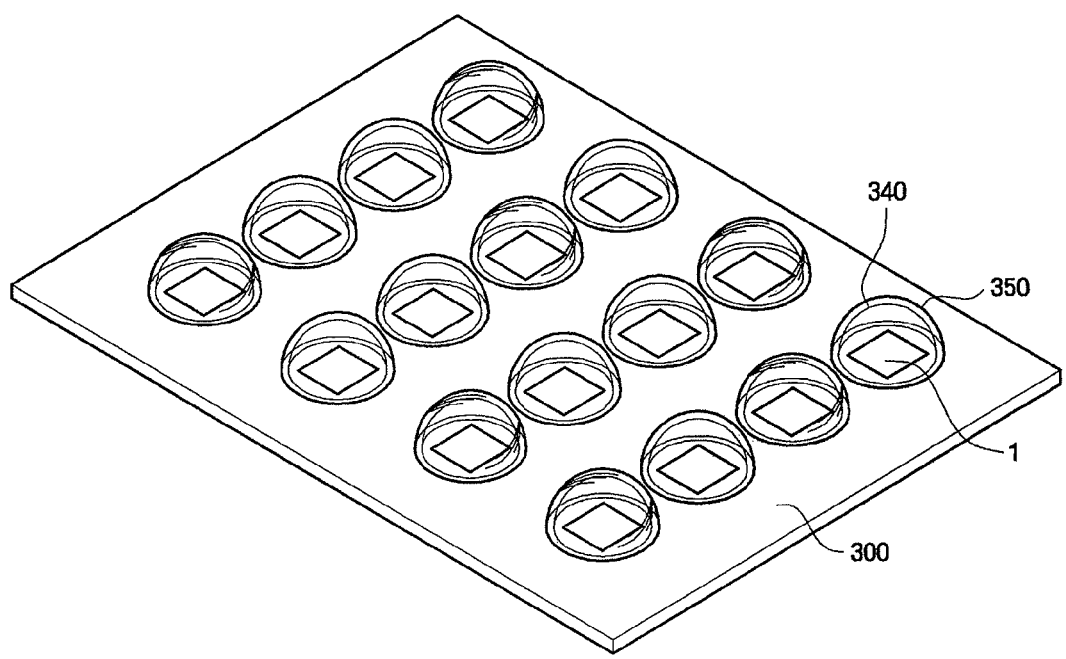

FIGS. 20 to 21B are diagrams illustrating a light-emitting system according to the third exemplary embodiment of the invention. In particular, FIGS. 21A and 21B show an example in which a phosphor layer 340 and a transparent resin 350 are formed on a light-emitting package array.

FIG. 20 shows a light-emitting package array having a plurality of light-emitting packages 11 arranged on the circuit board 300 in a light-emitting system 23 according to the third exemplary embodiment of the invention.

The first conductive regions 310 and the second conductive regions 320 extend in parallel to each other in the same direction on the circuit board 300. The light-emitting packages 11 are provided between the first conductive regions 310 and the second conductive regions 320. A plurality of light-emitting packages 11 are arranged in parallel to each other so as to extend in the direction in which the first conductive region 310 and the second conductive region 320 extend. The first conductive region 310 is electrically connected to the lead 214a of the light-emitting package 11, and the second conductive region 320 is electrically connected to the lead 214b of the light-emitting package 11. When a first bias is applied to the first conductive region 310 and a second bias is applied to the second conductive region 320, a forward bias is applied to a light-emitting element in the light-emitting package 11, which causes the plurality of light-emitting packages 11 to emit light at the same time.

Referring to FIG. 21A, the phosphor layer 340 and the transparent resin 350 may be formed in linear shapes. For example, when the light-emitting package 11 is arranged in the direction in which the first and second conductive regions 310 and 320 extend as shown in FIG. 14A, the phosphor layer 340 and the transparent resin 350 may also be arranged in the direction in which the first and second conductive regions 310 and 320 extend. The phosphor layer 340 and the transparent resin 350 may be formed so as to surround both the first conductive region 310 and the second conductive region 320.

Referring to FIG. 21B, the phosphor layer 340 and the transparent resin 350 may be formed in dots. In this case, the phosphor layer 340 and the transparent resin 350 may be formed so as to surround only the corresponding light-emitting package 11.

Figure 22:
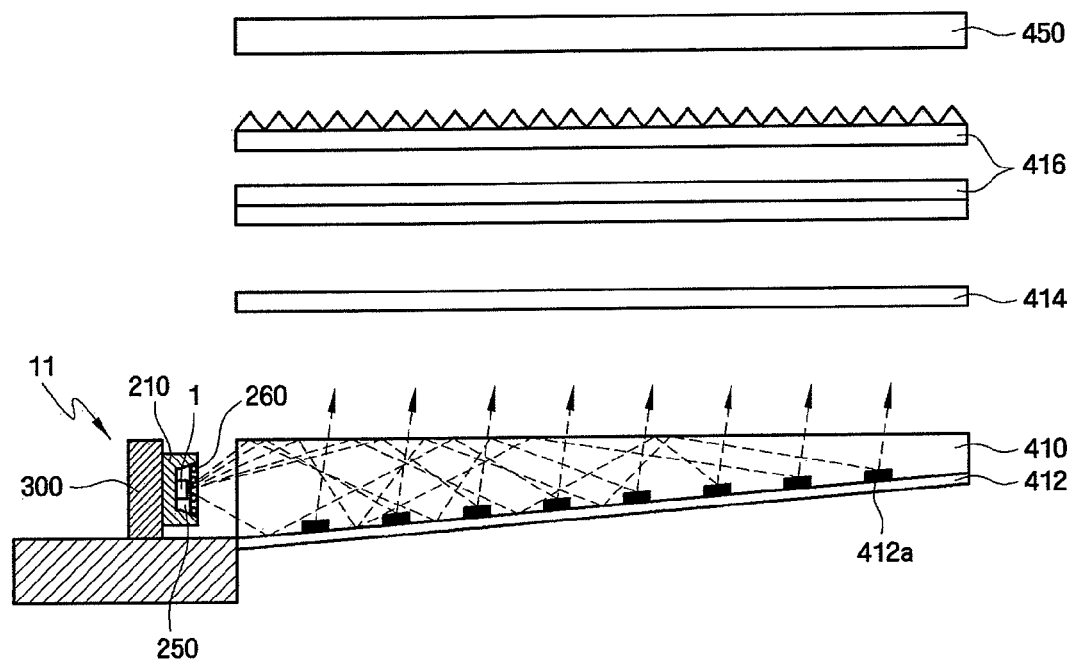
FIG. 22 is a diagram illustrating a light-emitting system according to the fourth exemplary embodiment of the present invention.

FIG. 22 is a diagram illustrating a light-emitting system according to the fourth exemplary embodiment of the invention.

FIG. 22 shows an example of an end product to which the light-emitting system described with reference to FIGS. 18 to 21B is applied. The light-emitting system may be applied to various apparatuses, such as, for example, an illuminating device, a display device, and a mobile apparatus (for example, a mobile phone, an MP3 player, and a navigation system). The device shown in FIG. 22 is an edge type backlight unit (BLU) used in a liquid crystal display (LCD). As the liquid crystal display does not have a light source therein, the backlight unit is used as a light source, and the backlight unit illuminates the rear surface of a liquid crystal panel.

Referring to FIG. 22, the backlight unit includes the light-emitting package 11, a light guide plate 410, a reflecting plate 412, a diffusion sheet 414, and a pair of prism sheets 416.

The light-emitting element 1 emits light. The light-emitting element 1 may be a side view type. As described above, the light-emitting element 1 is arranged in the slot of the package body 210 of the light-emitting package 11.

The light guide plate 410 guides light emitted to the liquid crystal panel 450. The light guide plate 410 is formed of a transparent plastic material, such as, for example, acrylic resin, and guides light emitted from the light-emitting element 1 to the liquid crystal panel 450 that is provided above the light guide plate 410. Therefore, various patterns 412a that change the traveling direction of light incident on the light guide plate 410 to the liquid crystal panel 450 are printed on the rear surface of the light guide plate 410.

The reflecting plate 412 is provided on the lower surface of the light guide plate 410 to reflect light emitted from the lower side of the light guide plate 410 to the upper side. The reflecting plate 412 reflects light that is not reflected by the patterns 412a, which is provided on the rear surface of the light guide plate 410, to the emission surface of the light guide plate 410. In this way, it is possible to reduce light loss and improve the uniformity of light emitted from the emission surface of the light guide plate 410.

The diffusion sheet 414 diffuses light emitted from the light guide plate 410 to prevent partial light concentration.

Trigonal prisms are formed on the upper surface of the prism sheet 416 in a predetermined array. In general, two prism sheets are arranged such that the prisms deviate from each other at a predetermined angle. In this way, the prism sheets make light diffused by the diffusion sheet 414 travel in a direction that is vertical to the liquid crystal panel 450.

FIGS. 23 to 26 are diagrams illustrating light-emitting systems according to the fifth to eighth exemplary embodiments of the invention.

Figure 23:
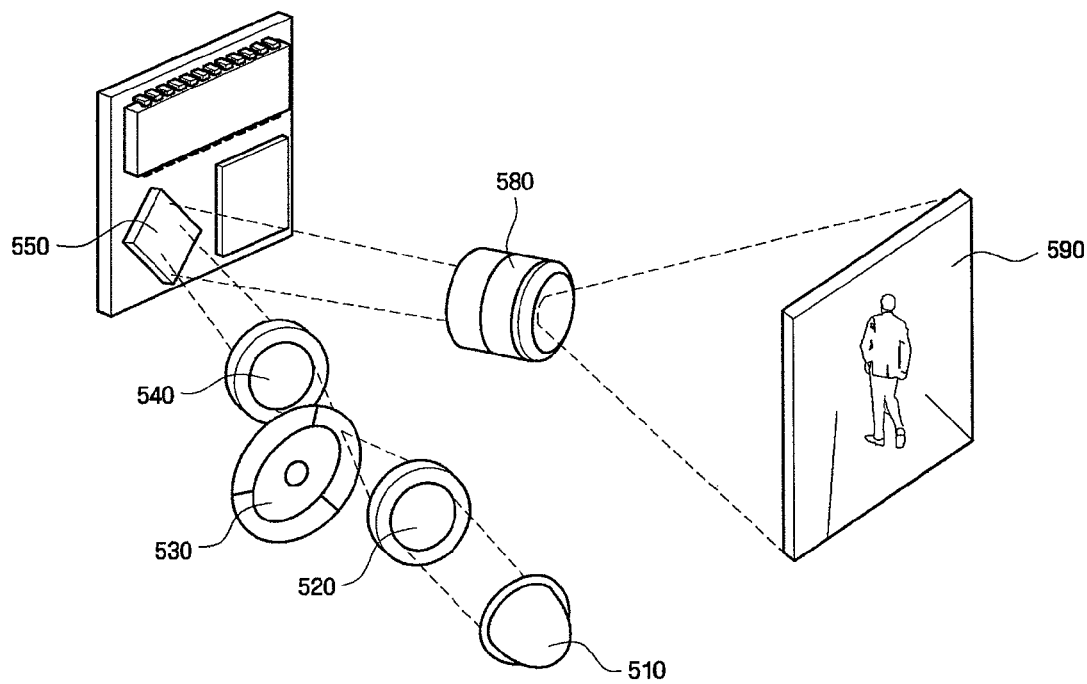
FIGS. 23 to 26 are diagrams illustrating light-emitting systems according to fifth to eighth exemplary embodiments of the present invention.
Figure 24:
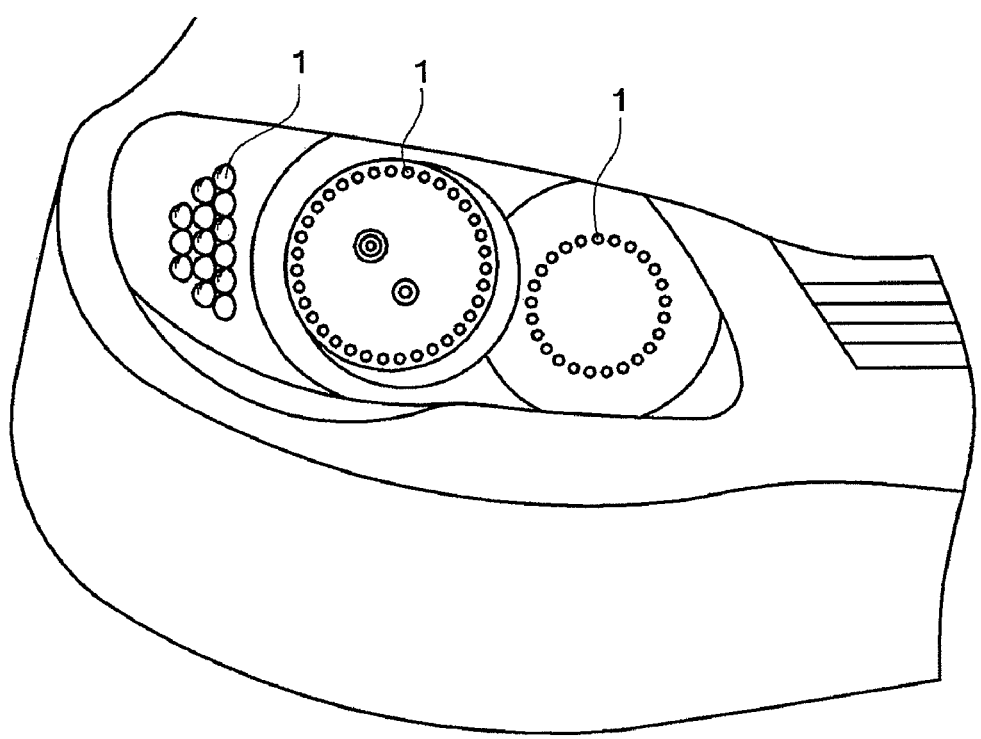
Figure 25:
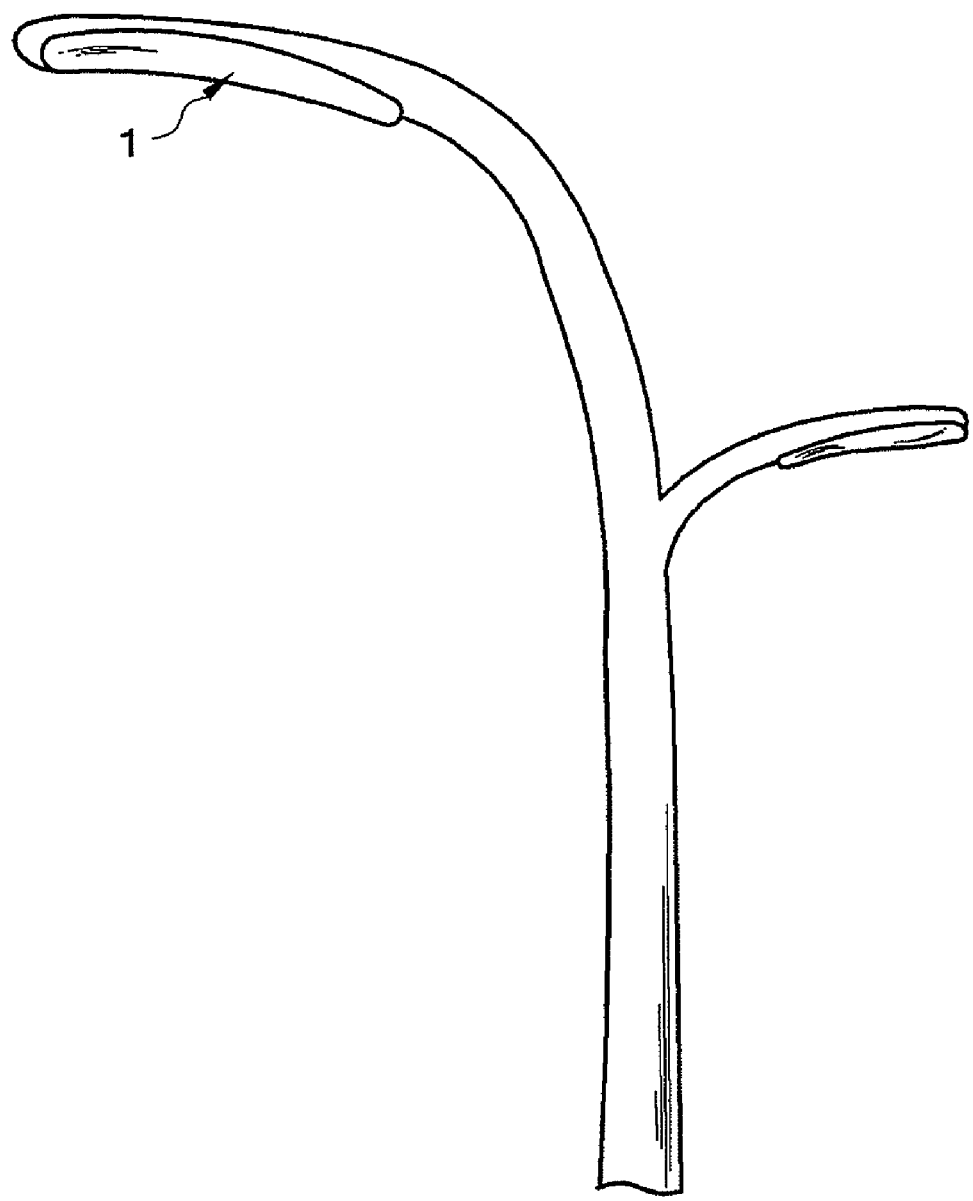
Figure 26:
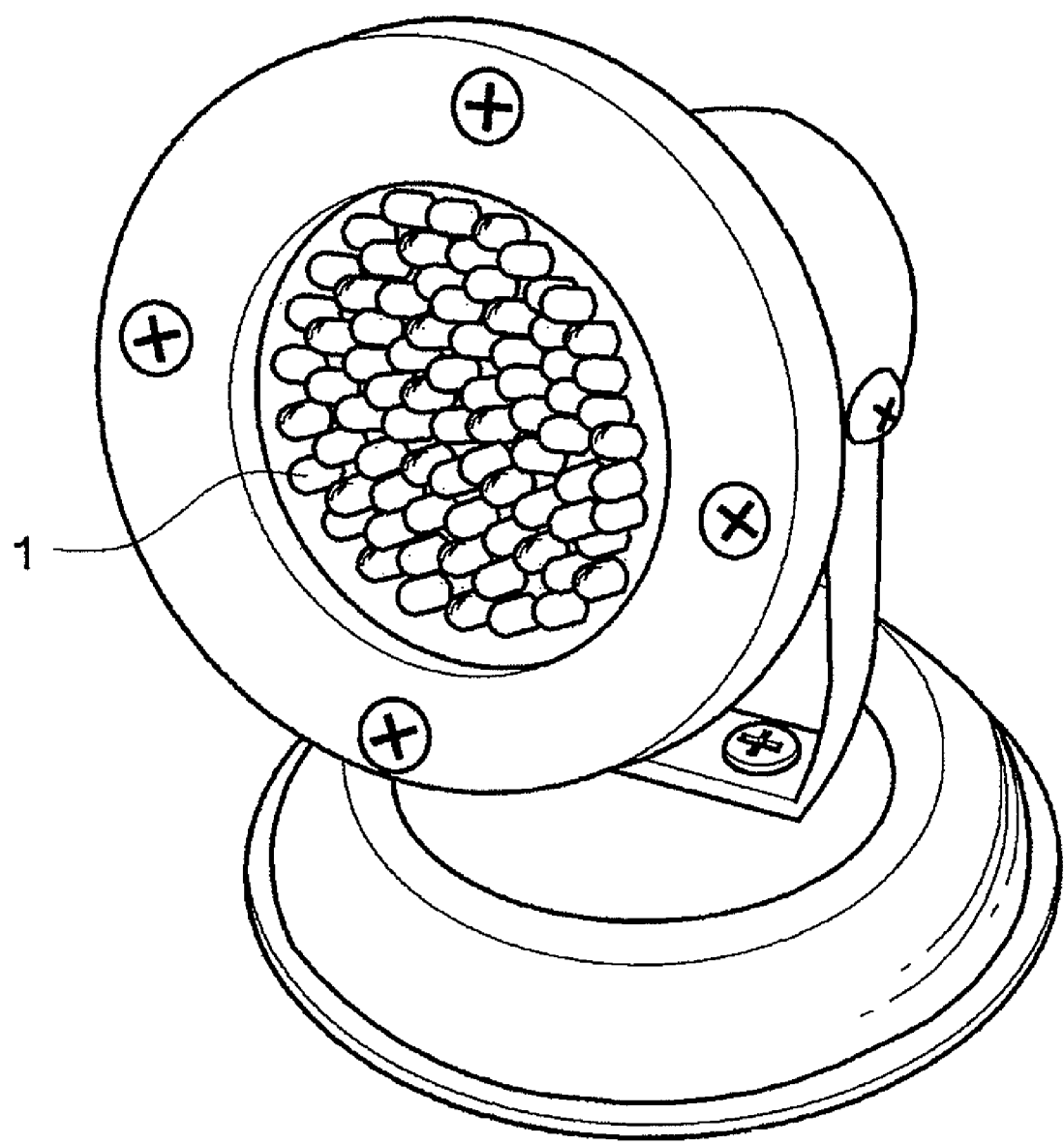

FIGS. 23 to 26 show end products to which the above-mentioned light-emitting system is applied. FIG. 23 shows a projector, FIG. 24 shows a car headlight, FIG. 25 shows a streetlamp, and FIG. 26 shows a lamp. The light-emitting elements 1 used for the lighting devices shown in FIGS. 23 to 26 may be a top view type.

Referring to FIG. 23, light emitted from a light source 510 passes through a condensing lens 520, a color filter 530, and a sharping lens 540 and is then reflected from a digital micro-mirror device (DMD) 550. Then, the light reaches a screen 590 through a projection lens 580. The light-emitting element according to the above-described exemplary embodiments of the invention is provided in the light source 510.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of manufacturing a light-emitting element, the method comprising:
    forming a first conductive layer of a first conductive type, a light-emitting layer, and a second conductive layer of a second conductive type on at least one first substrate;
    forming an ohmic layer on the second conductive layer;
    bonding the at least one first substrate to a second substrate, the second substrate being larger than the first substrate;
    etching portions of the ohmic layer, the second conductive layer, and the light-emitting layer to expose a portion of the first conductive layer;
    forming a first electrode on the exposed first conductive layer;
    forming a second electrode on the ohmic layer;
    removing the second substrate after the first and second electrodes are formed;
    reducing the thickness of the first substrate; and
    dividing the first substrate into chips.

2. The method of claim 1, further comprising:
    before the ohmic layer is formed, performing a first annealing on the first substrate having the first conductive layer, the light-emitting layer, and the second conductive layer formed thereon.

3. The method of claim 2, further comprising:
    performing an annealing on the first and second substrates bonded to each other after the first and second electrodes are formed,
    wherein the process temperature of the annealing performed on the first and second substrate bonded to each other is lower than that of the first annealing.

4. The method of claim 2, further comprising:
    before the bonding of the first and second substrates to each other, performing a second annealing on the first substrate having the ohmic layer formed thereon.

5. The method of claim 4, further comprising:
    performing a third annealing on the first and second substrates bonded to each other after the first and second electrodes are formed, wherein the process temperature of the third annealing is lower than that of the second annealing.

6. The method of claim 1, wherein the bonding of the at least one first substrate to the second substrate is performed by at least one of direct bonding and adhesive bonding.

7. The method of claim 6, wherein:
the direct bonding includes:
pre-treating a bonding surface of the second substrate or a bonding surface of the at least one first substrate; and
performing a heat treatment on the second substrate and the at least one first substrate, or physically compressing the second substrate and the at least one first substrate.

8. The method of claim 7, wherein the pre-treatment includes a plasma treatment or a wet treatment.

9. The method of claim 7, further comprising:
before the pre-treatment, polishing at least one of the bonding surface of the first substrate and the bonding surface of the second substrate.

10. The method of claim 7, further comprising:
before the pre-treatment, cleaning the first substrate and the second substrate.

11. The method of claim 6, wherein:
the adhesive bonding includes:
interposing an intermediate material layer between the bonding surface of the second substrate and the bonding surface of the at least one first substrate; and
performing a heat treatment on the second substrate and the at least one first substrate, or physically compressing the second substrate and the at least one first substrate.

12. The method of claim 1, wherein the first substrate is an insulating substrate, and the second substrate is a conductive substrate.

13. The method of claim 1, wherein the first conductive layer, the light-emitting layer, and the second conductive layer each include $In_xAl_yGa_{(1-x-y)}N$ ($0 \leq x \leq 1$, and $0 \leq y \leq 1$).

14. The method of claim 1, wherein the first conductive type is an n type, and the second conductive type is a p type.

15. A method of manufacturing a light-emitting element, the method comprising:
sequentially forming a first conductive layer of a first conductive type, a light-emitting layer, and a second conductive layer of a second conductive type on at least one insulating substrate;
forming an ohmic layer on the second conductive layer;
performing a first annealing on the at least one insulating substrate at a first temperature;
bonding the at least one insulating substrate to a conductive substrate, the conductive substrate being larger than the insulating substrate;
sequentially etching portions of the ohmic layer, the second conductive layer, and the light-emitting layer to expose a portion of the first conductive layer;
performing a second annealing on the insulating substrate and the conductive substrate bonded to each other at a second temperature that is lower than the first temperature;
forming a first electrode on the exposed first conductive layer;
forming a second electrode on the ohmic layer;
removing the conductive substrate after the first and second electrodes are formed;
reducing the thickness of the insulating substrate; and
dividing the insulating substrate into chips.

16. The method of claim 15, wherein
the sequentially forming of the first conductive layer of the first conductive type, the light-emitting layer, and the second conductive layer of the second conductive type on the insulating substrate is performed before the first annealing.

17. The method of claim 16, wherein
the forming of the ohmic layer on the second conductive layer is performed before the first annealing.

18. The method of claim 17, wherein
the sequentially etching portions of the ohmic layer, the second conductive layer, and the light-emitting layer to expose the portion of the first conductive layer and the forming of the first and second electrodes
are performed after the bonding of the at least one insulating substrate to the conductive substrate and prior to the second annealing.

19. The method of claim 15, wherein the bonding of the at least one insulating substrate to the conductive substrate is performed by at least one of direct bonding and adhesive bonding.

20. A method of manufacturing a light-emitting element, the method comprising:
forming a first GaN layer of an n type, a light-emitting layer, a second GaN layer of a p type on at least one sapphire substrate;
performing a first annealing on the at least one sapphire substrate;
forming an ohmic layer on the second GaN layer;
performing a second annealing on the at least one sapphire substrate;
bonding the at least one sapphire substrate to a silicon substrate, the silicon substrate being larger than the sapphire substrate;
etching portions of the ohmic layer, the second GaN layer, and the light-emitting layer to expose a portion of the first GaN layer;
forming a first electrode on the exposed first GaN layer; and
forming a second electrode on the ohmic layer
removing the silicon substrate after the first and second electrodes are formed;
reducing the thickness of the sapphire substrate; and
dividing the sapphire substrate into chips.

21. The method of claim 20, further comprising:
before or after the first and second electrodes are formed, performing a third annealing on the sapphire substrate and the silicon substrate bonded to each other,
wherein the process temperature of the third annealing is lower than that of the first annealing or the second annealing.

22. A method of manufacturing a light-emitting device using the method of manufacturing a light-emitting element according to claim 1.

* * * * *